(12) United States Patent
Karda et al.

(10) Patent No.: US 11,856,799 B2
(45) Date of Patent: Dec. 26, 2023

(54) SEMICONDUCTOR DEVICES, HYBRID TRANSISTORS, AND RELATED METHODS

(71) Applicant: Micron Technology, Inc., Boise, ID (US)

(72) Inventors: Kamal M. Karda, Boise, ID (US); Haitao Liu, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 286 days.

(21) Appl. No.: 17/182,953

(22) Filed: Feb. 23, 2021

(65) Prior Publication Data

US 2021/0183951 A1    Jun. 17, 2021

Related U.S. Application Data

(62) Division of application No. 16/118,110, filed on Aug. 30, 2018, now Pat. No. 10,943,953.

(Continued)

(51) Int. Cl.
*H01L 21/8234* (2006.01)
*H10B 63/00* (2023.01)
(Continued)

(52) U.S. Cl.
CPC .............. *H10B 63/84* (2023.02); *G11C 5/12* (2013.01); *G11C 13/0002* (2013.01);
(Continued)

(58) Field of Classification Search
CPC ......... H01L 21/823487; H01L 29/4908; H01L 29/66666; H01L 29/66795; H01L 29/7827
See application file for complete search history.

(56) References Cited

U.S. PATENT DOCUMENTS 5,739,057 A    4/1998 Tiwari et al.
6,261,950 B1    7/2001 Tobben et al.
(Continued)

FOREIGN PATENT DOCUMENTS

CN    1675778 A    9/2005
CN    102122673 A    7/2011
(Continued)

OTHER PUBLICATIONS

European Communication pursuant to Article 94(3) EPC for European Application No. 18852228, dated Dec. 19, 2022, 5 pages.
(Continued)

*Primary Examiner* — Mark V Prenty
(74) *Attorney, Agent, or Firm* — TraskBritt

(57) ABSTRACT

Methods of forming a semiconductor device are disclosed. A method comprising forming a hybrid transistor supported by a substrate. Forming the hybrid transistor comprises forming a source including a first low bandgap high mobility material, and forming a channel including a high bandgap low mobility material coupled with the first low bandgap high mobility material. Forming the hybrid transistor further comprises forming a drain including a second low bandgap high mobility material coupled with the a high bandgap low mobility material, and forming a gate separated from the channel via a gate oxide material. Methods of forming a transistor are also disclosed.

18 Claims, 12 Drawing Sheets

Related U.S. Application Data

(60) Provisional application No. 62/552,824, filed on Aug. 31, 2017.

(51) Int. Cl.

| | |
|---|---|
| *G11C 13/00* | (2006.01) |
| *H01L 27/12* | (2006.01) |
| *H01L 29/49* | (2006.01) |
| *H01L 29/66* | (2006.01) |
| *H01L 29/78* | (2006.01) |
| *H01L 29/786* | (2006.01) |
| *G11C 5/12* | (2006.01) |
| *H10N 70/00* | (2023.01) |
| *H10N 70/20* | (2023.01) |
| *G11C 11/401* | (2006.01) |
| *G11C 11/16* | (2006.01) |
| *G11C 11/22* | (2006.01) |

(52) U.S. Cl.
CPC .. *H01L 21/823487* (2013.01); *H01L 27/1225* (2013.01); *H01L 29/4908* (2013.01); *H01L 29/66666* (2013.01); *H01L 29/66795* (2013.01); *H01L 29/7827* (2013.01); *H01L 29/7869* (2013.01); *H01L 29/78642* (2013.01); *H01L 29/78696* (2013.01); *H10B 63/22* (2023.02); *H10B 63/24* (2023.02); *H10B 63/34* (2023.02); *H10N 70/011* (2023.02); *H10N 70/245* (2023.02); *H10N 70/828* (2023.02); *H10N 70/841* (2023.02); *H10N 70/883* (2023.02); *G11C 11/1659* (2013.01); *G11C 11/2259* (2013.01); *G11C 11/401* (2013.01); *G11C 13/003* (2013.01); *G11C 2213/79* (2013.01); *H01L 29/78618* (2013.01)

(56) References Cited

U.S. PATENT DOCUMENTS

| | | | |
|---|---|---|---|
| 6,420,784 B2 | 7/2002 | Hu et al. | |
| 6,888,769 B2 | 5/2005 | Kirsch | |
| 7,842,558 B2 | 11/2010 | Juengling | |
| 8,514,626 B2 | 8/2013 | Sandhu et al. | |
| 8,530,939 B2 | 9/2013 | Sills et al. | |
| 8,541,765 B2 | 9/2013 | Marsh et al. | |
| 8,598,562 B2 | 12/2013 | Sills | |
| 8,652,909 B2 | 2/2014 | Sills et al. | |
| 8,711,603 B2 | 4/2014 | Sills | |
| 8,958,228 B2 | 2/2015 | Samachisa et al. | |
| 8,969,154 B2 | 3/2015 | Sandhu | |
| 9,112,046 B2 | 8/2015 | Sandhu et al. | |
| 9,177,872 B2 | 11/2015 | Sandhu | |
| 9,356,155 B2 | 5/2016 | Sandhu | |
| 9,397,145 B1 | 7/2016 | Sills et al. | |
| 9,698,272 B1 | 7/2017 | Ikeda et al. | |
| 10,943,953 B2 * | 3/2021 | Karda | H01L 21/823487 |
| 2002/0028568 A1 | 3/2002 | Ueno et al. | |
| 2002/0125535 A1 | 9/2002 | Ueda | |
| 2003/0107044 A1 | 6/2003 | Kubota et al. | |
| 2003/0122140 A1 | 7/2003 | Yamazaki et al. | |
| 2003/0234414 A1 | 12/2003 | Brown | |
| 2005/0104068 A1 | 5/2005 | Yamazaki | |
| 2005/0236671 A1 | 10/2005 | Schuele et al. | |
| 2005/0270830 A1 | 12/2005 | Tuttle | |
| 2006/0065927 A1 | 3/2006 | Thean et al. | |
| 2006/0175609 A1 | 8/2006 | Chan et al. | |
| 2006/0220087 A1 | 10/2006 | Fishburn | |
| 2008/0237687 A1 | 10/2008 | Kim et al. | |
| 2008/0251825 A1 | 10/2008 | Lee | |
| 2009/0008631 A1 | 1/2009 | Hurkx et al. | |
| 2010/0025678 A1 | 2/2010 | Yamazaki et al. | |
| 2010/0051949 A1 | 3/2010 | Yamazaki et al. | |
| 2010/0084649 A1 | 4/2010 | Seo et al. | |
| 2010/0140614 A1 | 6/2010 | Uchiyama et al. | |
| 2010/0295120 A1 | 11/2010 | Sandhu et al. | |
| 2010/0301325 A1 | 12/2010 | Bae et al. | |
| 2011/0097842 A1 | 4/2011 | Yang et al. | |
| 2011/0108833 A1 | 5/2011 | Yamazaki et al. | |
| 2011/0133248 A1 | 6/2011 | Chen et al. | |
| 2011/0140195 A1 | 6/2011 | Zahurak et al. | |
| 2011/0156025 A1 | 6/2011 | Shionoiri et al. | |
| 2011/0215328 A1 | 9/2011 | Morosawa et al. | |
| 2011/0250745 A1 | 10/2011 | Millward et al. | |
| 2012/0132914 A1 | 5/2012 | Chen | |
| 2012/0161126 A1 | 6/2012 | Yamazaki | |
| 2012/0286259 A1 | 11/2012 | Park et al. | |
| 2013/0069052 A1 | 3/2013 | Sandhu | |
| 2013/0134415 A1 | 5/2013 | Godo | |
| 2013/0228926 A1 | 9/2013 | Maeda et al. | |
| 2013/0277670 A1 | 10/2013 | Isobe | |
| 2014/0021485 A1 | 1/2014 | Cho | |
| 2014/0027839 A1 | 1/2014 | Kim | |
| 2014/0091303 A1 | 4/2014 | Yamazaki et al. | |
| 2014/0361239 A1 | 12/2014 | Ramaswamy et al. | |
| 2015/0021591 A1 | 1/2015 | Kim et al. | |
| 2015/0069320 A1 | 3/2015 | Rabkin et al. | |
| 2015/0091058 A1 | 4/2015 | Doyle et al. | |
| 2015/0179747 A1 | 6/2015 | Ito et al. | |
| 2015/0243562 A1 | 8/2015 | Sunamura et al. | |
| 2015/0287745 A1 | 10/2015 | Kato | |
| 2015/0372104 A1 | 12/2015 | Liu et al. | |
| 2015/0372135 A1 | 12/2015 | Park | |
| 2016/0049406 A1 | 2/2016 | Sandhu | |
| 2016/0141419 A1 | 5/2016 | Baenninger et al. | |
| 2016/0197099 A1 | 7/2016 | Sasaki | |
| 2016/0315196 A1 | 10/2016 | Barlage et al. | |
| 2017/0104014 A1 | 4/2017 | Sasaki | |
| 2018/0350879 A1 | 12/2018 | Sel et al. | |
| 2019/0237556 A1 | 8/2019 | Tsuruma et al. | |
| 2019/0348540 A1 | 11/2019 | Pillarisetty et al. | |
| 2020/0266304 A1 | 8/2020 | Ueoka et al. | |

FOREIGN PATENT DOCUMENTS

| | | |
|---|---|---|
| CN | 103178048 A | 6/2013 |
| CN | 104201205 A | 12/2014 |
| JP | 07-099286 A | 7/1987 |
| JP | 08-330593 A | 10/1994 |
| JP | 2008-515224 | 4/2006 |
| JP | 2010-177450 A | 8/2010 |
| JP | 2012-064934 | 3/2012 |
| JP | 2012-119664 | 6/2012 |
| JP | 2012-151461 | 8/2012 |
| JP | 2013-125917 | 6/2013 |
| JP | 2014-045009 A | 3/2014 |
| JP | 2015-111663 A | 6/2015 |
| JP | 2013-077815 | 10/2015 |
| JP | 2015-231025 A | 12/2015 |
| KR | 10-0882677 B1 | 2/2009 |
| KR | 10-2012-0015963 A | 2/2012 |
| KR | 10-2013-0073843 A | 7/2013 |
| KR | 10-2014-0011570 A | 1/2014 |

OTHER PUBLICATIONS

Korean Notice of Reasons for Rejection for Korean Application No. 10-2022-7015195, dated Oct. 18, 2022, 6 pages with English translation.

Japanese Second Office Action for Application No. 2020-508381, dated Nov. 16, 2021, 11 pages.

Choi et al., A Transparent Diode with High Rectifying Ratio Using Amorphous Indium-Gallium-Zinc Oxide/SiNx Coupled Junction, Applied Physics Letters, vol. 107, (2015), pp. 053501-01-053501-4.

European Search Report and Opinion for European Application No. 18852228, dated Oct. 5, 2020, 13 pages.

Fung et al., Two Dimensional Numerical Simulation of Radio Frequency Sputter Amorphous In—Ga—Zn—O Thin-Film Transistors, Journal of Applied Physics, vol. 106, (2009), 084511-1-084511-10.

(56) References Cited

OTHER PUBLICATIONS

Hofmann et al., Surrounding Gate Select Transistor for 4F2 Stacked Gbit DRAM, 31st European Solid-State Device Research Conference, Sep. 11-13, 2001, 4 pages.
International Search Report from International Application No. PCT/US2018/048934, dated Dec. 21, 2018, 3 pages.
International Written Opinion from International Application No. PCT/US2018/048934, dated Dec. 21, 2018, 10 pages.
Kaczmarski et al., Revising Ru—Si—O as a Nanocrystalline Schottky Electrode for Oxide Semiconductors, 2016 International School and Conference of Physics of Semiconductors, Jun. 21, 2016, 1 page.
Kaczmarski et al., Transparent Amorphous Ru—Si—O Schottky contacts to In—Ga—Zn—O, Journal of Display Technology, vol. 11, Issue 6, p. 528.
Kim et al., High Performance PRAM Cell Scalable to Sub-20nm Technology with Below 4F2 Cell Size, Extendable to DRAM Applications, 2010 Symposium on VLSI Technology Digest of Technical Papers, (2010), pp. 203-204.
Korean Office Action for Application No. 10-2020-7008922, dated Dec. 23, 2020, 13 pages.
Kumomi et al., Materials, Devices, and Circuits of Transparent Amorphous-Oxide Semiconductor, Journal of Display Technology, vol. 5, No. 12, (Dec. 2009), pp. 531-540.
Kurweil Accelerting Intelligence, News, Ultra-Low-Power Transistors Could Function for Yeast Without a Battery, http://www.kurzweilai.net/ultra-low-power-transistors-could-function-for-years-without-a-battery, (Oct. 25, 2016), 2 pages.
Li et al., Novel Schottky Barrier MOSFET with Dual-Layer Silicide Source/Drain Structure, Proceedings. 7th International Conference on Solid-State and Integrated Circuits Technology, Oct. 18-21, 20104, pp. 69-72.
Liang et al., Cross-Point Memory Array Without Cell Selectors—Device Characteristics and Data Storage Pattern Dependencies, IEEE Transactions on Electron Devices, vol. 57, No. 10, (Oct. 2010), pp. 2531-2538.
Matsuzaki et al., 1Mb-Volatile Random Access Memory Using Oxide Semiconductor, 2011 3rd IEEE International Memory Workshop (IMW), May 22-25, 2011, 4 pages.
Munzenrieder et al., Room Temperature Fabricated Flexible NiO/IGZO pn Diode Under Mechanical Strain, Solid-State Electronics, vol. 87, (2013), pp. 17-20.
Sasago et al., Cross-Point Phase Change Memory with 4F2 Cell Size Driven by Low-Contact-Resistivity Poly-Si Diode, 2009 Symposium on VLSI Technology Digest of Technical Papers, (2009), pp. 24-25.
Song et al., Short Channel Characteristics of Gallium-Indium-Zinc-Oxide Thin Film Transistors for Three-Dimensional Stacking Memory, IEEE Electron Device Letters, vol. 29, No. 6, (Jun. 2008), pp. 549-552.
Supplementary Partial European Search Report for European Application No. 18852228.8, dated Aug. 4, 2020, 11 pages.
Wager et al., Thin, Fast, and Flexible Semiconductors, IEEE Spectrum, (Apr. 28, 2011), 5 pages.
Yoon et al., A Novel Low Leakage Current VPT (Vertical Pillar Transistor) Integration for 4F2 DRAM Cell Array with Sub 40 nm Technology, 2006 64th Device Research Conference, (Jun. 26-28, 2006), pp. 259-260.
Japanese Notice of Rejection Ground for Application No. 2020-508381, dated Apr. 27, 2021, 13 pages.
Korean Second Office Action for Application No. 10-2020-7008922, dispatched Jun. 25, 2021, 8 pages.

\* cited by examiner

SEMICONDUCTOR DEVICES, HYBRID TRANSISTORS, AND RELATED METHODS

CROSS-REFERENCE TO RELATED APPLICATION

This application is a divisional of U.S. patent application Ser. No. 16/118,110, filed Aug. 30, 2018, now U.S. Pat. No. 10,943,953, issued Mar. 9, 2021, which claims the benefit under 35 U.S.C. § 119(e) of U.S. Provisional Patent Application Ser. No. 62/552,824, filed Aug. 31, 2017, the disclosure of each of which is hereby incorporated herein in its entirety by this reference.

TECHNICAL FIELD

The present disclosure, in various embodiments, relates generally to the field of transistor design and fabrication. More particularly, this disclosure relates to the design and fabrication of semiconductor devices and to hybrid transistors.

BACKGROUND

Transistors may be utilized in a variety of different semiconductor devices. For example, a transistor utilized in a memory cell may be referred to in the art as an "access transistor." The transistor conventionally includes a channel region between a pair of source/drain regions and a gate configured to electrically connect the source/drain regions to one another through the channel region. The channel region is usually formed of a uniform semiconductor material; however, other materials have also been used.

Transistors used in volatile memory cells, such as dynamic random access memory (DRAM) cells, may be coupled to a storage element. The storage element may, for example, include capacitor (e.g., sometimes referred to as a "cell capacitor" or a "storage capacitor") configured to store a logical state (e.g., a binary value of either 0 or 1) defined by the storage charge in the capacitor.

To charge, discharge, read, or recharge the capacitor, the transistor may be selectively turned to an "on" state, in which current flows between the source and drain regions through the channel region of the transistor. The transistor may be selectively turned to an "off" state, in which the flow of current is substantially halted. Ideally, in the off state, the capacitor would retain, without change, its charge. However, capacitors of conventional volatile memory cells experience discharges of current over time. Therefore, even in the "off" state, a conventional volatile memory cell will often still undergo some flow of current from the capacitor. This off-state leakage current is known in the industry as a sub-threshold leakage current.

To account for the sub-threshold leakage current and to maintain the capacitor of the memory cell at an appropriate charge to correspond to its intended logical value, conventional volatile memory cells are frequently refreshed. The sub-threshold leakage current can also impact the fabrication and configuration of an array of memory cells within a memory device. Sub-threshold leakage current rates, refresh rates, cell size, and thermal budgets of memory cells are often important considerations in the design, fabrication, and use of volatile memory cells and arrays of cells incorporated in memory devices. Conventional transistors having a uniform oxide semiconductor channel have a sub-threshold leakage current that is typically lower than devices that have channels formed from a uniform semiconductor material.

DETAILED DESCRIPTION

Figure 1A:
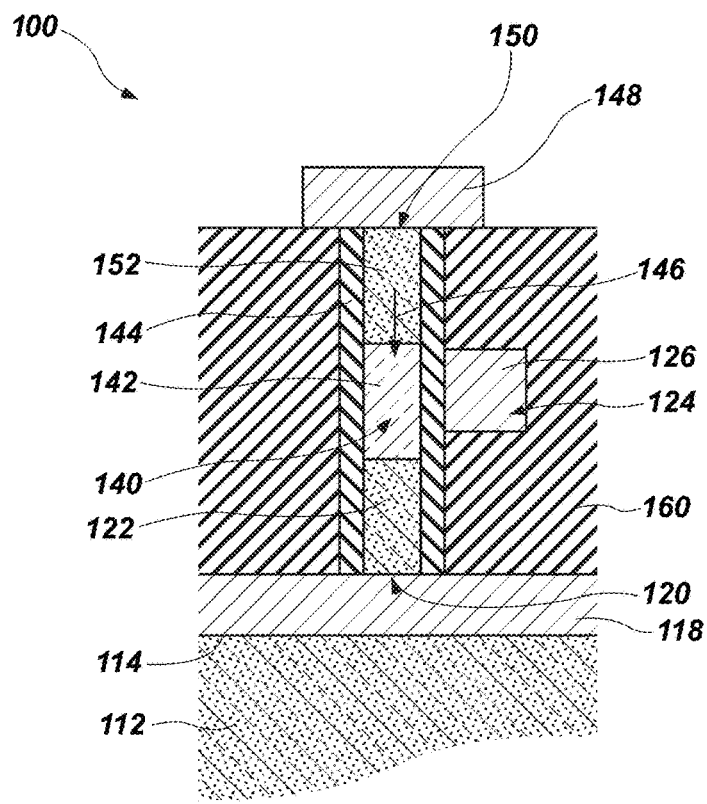
FIG. 1A is a cross-sectional front view of a schematic of a thin film transistor according to an embodiment of the present disclosure.

Thin film transistors are disclosed, such as may be incorporated in memory structures, memory cells, arrays including such memory cells, memory devices, switching devices, and other semiconductor devices including such arrays, systems including such arrays, and methods for fabricating and using such memory structures are also disclosed. Embodiments of the disclosure include a variety of different memory cells (e.g., volatile memory, non-volatile memory) and/or transistor configurations. Non-limiting examples include random-access memory (RAM), read only memory (ROM), dynamic random access memory (DRAM), synchronous dynamic random access memory (SDRAM), flash memory, resistive random access memory (ReRAM), conductive bridge random access memory (conductive bridge RAM), magnetoresistive random access memory (MRAM), phase change material (PCM) memory, phase change random access memory (PCRAM), spin-torque-transfer random access memory (STTRAM), oxygen vacancy-based memory, programmable conductor memory, ferroelectric random access memory (FE-RAM), reference field-effect transistors (RE-FET), etc.

Some memory devices include memory arrays exhibiting memory cells arranged in a cross-point architecture including conductive lines (e.g., access lines, such as word lines) extending perpendicular (e.g., orthogonal) to additional conductive lines (e.g., data lines, such as bit lines). The memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells, Select devices can be used to select particular memory cells of a 3D memory array. Embodiments additionally may include thin field transistors utilized in non-access device implementations. Non-limiting examples of which include deck selector devices, back end of line (BEOL) routing selector devices, etc.

Embodiments of the present disclosure may include different configurations of transistors (e.g., thin film transistors (TFT)), including vertically oriented transistors, horizontally oriented transistors (i.e., planar), etc. The memory cells include hybrid access transistors formed different materials exhibiting different bandgap and mobility properties.

For example, in some embodiments at least a portion of the channel region may include a channel material that is formed from an amorphous oxide semiconductor. Non-limiting examples may include zinc tin oxide (ZTO), IGZO (also referred to as gallium indium zinc oxide (GIZO)), IZO, ZnOx, InOx, In2O3, SnO2, TiOx, $ZnO_yN_z$, $Mg_xZn_yO_z$, $In_xZn_yO_z$, $In_xGa_yZn_zO_a$, $Zr_xIn_yZn_zO_a$, $Hf_xIn_yZn_zO_a$, $Sn_xIn_yZn_zO_a$, $Al_xSn_yIn_zZn_aO_d$, $Si_xIn_yZn_zO_a$, $Zn_xSn_yO_z$, $Al_xZn_ySn_zO_a$, $Ga_xZn_ySn_zO_a$, $Zr_xZn_ySn_zO_a$, InGaSiO, and other similar materials.

As used herein, the term "substrate" means and includes a base material or construction upon which components, such as those within memory cells, are formed. The substrate may be a semiconductor substrate, a base semiconductor layer on a supporting structure, a metal electrode, or a semiconductor substrate having one or more layers, structures, or regions formed thereon. While materials described and illustrated herein may be formed as layers, the materials are not limited thereto and may be formed in other three-dimensional configurations. The substrate may be a conventional silicon substrate or other bulk substrate including a layer of semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation or other semiconductor or opto-electronic materials, such as silicon-germanium ($Si_{1-x}Ge_x$, where x may be, for example, a mole fraction between 0.2 and 0.8), germanium (Ge), gallium arsenide (GaAs), gallium nitride (GaN), or indium phosphide (InP). The substrate may be doped or may be undoped. Furthermore, when reference is made to a "substrate" in the following description, previous process stages may have been utilized to form regions or junctions in the base semiconductor structure or foundation.

As used herein, spatially relative terms, such as "beneath," "below," "lower," "bottom," "above," "upper," "top," "front," "rear," "left," "right," and the like, may be used for ease of description to describe one element or feature's relationship to another element(s) or feature(s) as illustrated in the figures. Unless otherwise specified, the spatially relative terms are intended to encompass different orientations of the device in use or operation in addition to the orientation depicted in the figures. For example, if a device in the figures is turned over, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The device may be otherwise oriented (rotated 90 degrees or at other orientations) and the spatially relative descriptors used herein interpreted accordingly. In addition, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the singular forms "a," "an," and "the" are intended to include the plural forms as well, unless the context clearly indicates otherwise. In addition, it should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

As used herein, "and/or" includes any and all combinations of one or more of the associated listed items.

As used herein, the term "configured" refers to a size, shape, material composition, and arrangement of one or more of at least one structure and at least one apparatus facilitating operation of one or more of the structure and the apparatus in a pre-determined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

The illustrations presented herein are not meant to be actual views of any particular component, structure, device, or system, but are merely representations that are employed to describe embodiments of the present disclosure. Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but include deviations in shapes that result, for example, from manufacturing. For example, a region illustrated or described as box shape may, typically, have rough and/or nonlinear features. Moreover, sharp angles that are illustrated may be rounded. Thus, the regions illustrated in the figures are schematic in nature and their shapes are not intended to illustrate the precise shape of a region and do not limit the scope of the present claims. Reference will now be made to the drawings, where like numerals refer to like components throughout. The drawings are not necessarily drawn to scale or proportionally for the different materials.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein. Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art. Unless the context indicates otherwise, the removal of materials described herein may be accomplished by any suitable technique including, but not limited to, etching, abrasive planarization, or other known methods.

A semiconductor device is disclosed. The semiconductor device comprises a hybrid transistor including a gate electrode, a drain material, a source material, and a channel material operatively coupled between the drain material and the source material. The source material and the drain material include a low bandgap high mobility material relative to the channel material that is high bandgap low mobility material.

Another semiconductor device is disclosed. The semiconductor device comprises a hybrid transistor including a channel region defined by a length of an adjacent gate electrode, and a drain region and a source region disposed on opposing ends of the channel region. The channel region includes at least a high bandgap low mobility material. The drain region and the source region each include at least a low bandgap high mobility material.

Figure 1B:
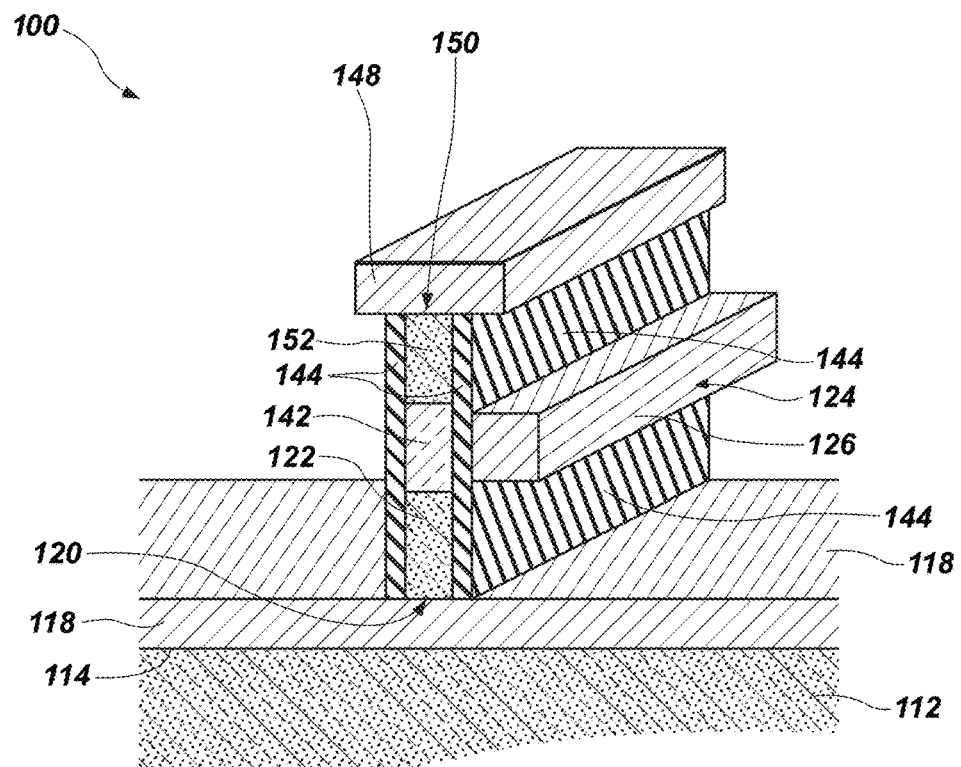
FIG. 1B is a cross-sectional perspective view of the schematic of FIG. 1A.

FIG. 1A is a cross-sectional front view of a schematic of a hybrid thin film transistor 100 according to an embodiment of the present disclosure. FIG. 1B is a cross-sectional perspective view of the thin film transistor 100 of FIG. 1A (for ease of illustration, first insulative material 160 is not depicted in FIG. 1B). FIG. 1A and FIG. 1B will be referred to together herein.

The transistor 100 includes a source region 120, a drain region 150, and a channel region 140 supported by a substrate 112. The channel region 140 may be operably coupled with both the source region 120 and the drain region 150. The transistor 100 may have a generally vertical orientation with the source region 120, the channel region 140, and the drain region 150 extending in a stack substantially vertically from the substrate 112. In other words, the transistor 100 may be a vertical transistor (i.e., a transistor in a vertical orientation).

The source region 120 may include a source material 122 coupled with a first conductive material 118 acting as a source contact. The first conductive material 118 may be disposed on a primary surface 114 of the substrate 112. In some embodiments, the first conductive material 118 may be disposed across the majority (e.g., entirety) of the primary surface 114 of the substrate 112. Alternatively, the first conductive material 118 may be formed within the substrate 112, with an upper surface of the first conductive material 118 occupying the same plane defined by the primary surface 114 of the substrate 112. In some embodiments, one or more barrier materials may be provided between the first conductive material 118 and the substrate 112.

The drain region 150 may include a drain material 152 coupled with a second conductive material 148 acting as a drain contact. In embodiments in which the transistor 100 is vertically disposed relative to the primary surface 114 of the substrate 112, the second conductive material 148 may be formed atop the drain material 152.

The channel region 140 may include a channel material 142 coupled between the source material 122 and the drain material 152. The materials 122, 142, 152 may further be situated at least partially within a first insulative material 160 as shown in FIG. 1A (not shown in FIG. 1B). The first insulative material 160 may surround and support the transistor 100. The first insulative material 160 may be a conventional interlayer dielectric material. A second insulative material 144 may isolate the channel material 142 from a gate electrode 126 formed of a third conductive material 124. The second insulative material 144 may be provided along sidewalls of the channel material 142, and in some embodiments along the sidewalls of the source material 122 and the drain material 152. The second insulative material 144 may be formed of a conventional gate insulator material, such as an oxide (e.g., silicon dioxide ($SiO_2$), high-K materials such as $HfO_2$, $AlO_x$, or combinations thereof). The second insulative material 144 may also be referred to as a "gate oxide."

The gate electrode 126 is configured to operatively interconnect with the channel region 140 to selectively allow current to pass through the channel region 140 when the transistor 100 is enabled (i.e., "on"). However, when the transistor 100 is disabled (i.e., "off"), current may leak from the drain region 150 to the source region 120 as indicated by arrow 146. The gate electrode 126 may be configured as an access line (e.g., a word line) arranged perpendicular to the first conductive material 118, which may be configured as a data/sense line (e.g., a bit line).

The transistor 100 may be a hybrid transistor in which the source material 122, the channel material 142, and the drain material 152 are different types of materials exhibiting different levels of mobility. In some embodiments, the source material 122 and the drain material 152 may be formed from a lower bandgap higher mobility material relative to the channel material 142 formed from a higher bandgap lower mobility material. For example, the source material 122 and the drain material 152 may be formed from a doped semiconductor material (e.g., Si, SiGe, Ge, SiCo, Transition Metal Dichalcogenides (TMD), etc.) and the channel material 142 may be formed from an oxide semiconductor material (e.g., ZTO, IGZO, IZO, $ZnO_x$, $InO_x$, $In_2O_3$, $SnO_2$, $TiO_x$, $Zn_xO_yN_z$, $Mg_xZn_yO_z$, $In_xZn_yO_z$, $In_xGa_yZn_zO_a$, $Zr_xIn_yZn_zO_a$, $Hf_xIn_yZn_zO_a$, $Sn_xIn_yZn_zO_a$, $Al_xSn_yIn_zZn_aO_d$, $Si_xIn_yZn_zO_a$, $Zn_xSn_yO_z$, $Al_xZn_ySn_zO_a$, $Ga_xZn_ySn_zO_a$, and $Zr_xZn_ySn_zO_a$, InGaSiO, and other similar materials, etc.). The doped semiconductor material may include N-doped materials or P-doped materials. The doping may be uniform or non-uniform as desired. In some embodiments, the source material 122 and/or the drain material 152 may be formed from low bandgap metal oxides (e.g., doped or undoped).

The hybrid transistor 100 includes a channel material 142 that has a high valence band offset relative to the source and drain materials 122, 152, which may suppress tunneling from the valence band inside the channel region 140 that may reduce the gate induced drain leakage (GIDL) similar to a conventional transistor with a uniform amorphous oxide semiconductor material extending between two conductive contacts. However, the source and drain materials 122, 152 may have higher mobility than the channel material 142, which may improve contact resistance ($R_{CON}$) with the source and drain contacts (materials 118, 148) and also improve the on current ($I_{ON}$) relative to conventional devices. Thus, the hybrid transistor 100 may exhibit the combined advantage of having a high on current ($I_{ON}$) and low off current ($I_{OFF}$) relative to conventional devices. In addition, the gate length ($L_G$) as well as the lengths of the different materials 122, 142, 152 may be selected for tuning other device metrics (e.g., DIBL, SVTM etc.) as desired.

In some embodiments, the materials 122, 142, 152 may be discrete regions as shown. As a result, within each region, the respective material 122, 142, 152 may be at least substantially uniform with a distinct transition therebetween. In some embodiments, the materials 122, 142, 152 may blend together—particularly at the transitions—before becoming substantially uniform. In some embodiments, the bandgap from the channel material 142 to the source and drain materials 122, 152 may be uniformly graded. While the length of the channel material 142 is shown as being approximately equal to the gate electrode 126 the length of the channel material 142 may be shorter or longer as desired. In some embodiments, it may be desirable to shorten the length of the channel material 142 relative to the lengths of the source and drain materials 122, 152 to increase the on current ($I_{ON}$) while still maintaining an acceptable off current ($I_{OFF}$).

Each of the first conductive material 118 and the second conductive material 148 may be formed of one metal, of a mixture of metals, or of layers of different metals. For example, without limitation, the first conductive material 118 and/or the second conductive material 148 may be formed of titanium nitride, copper, tungsten, tungsten nitride, molybdenum, other conductive materials, and any combination thereof.

Figure 4:
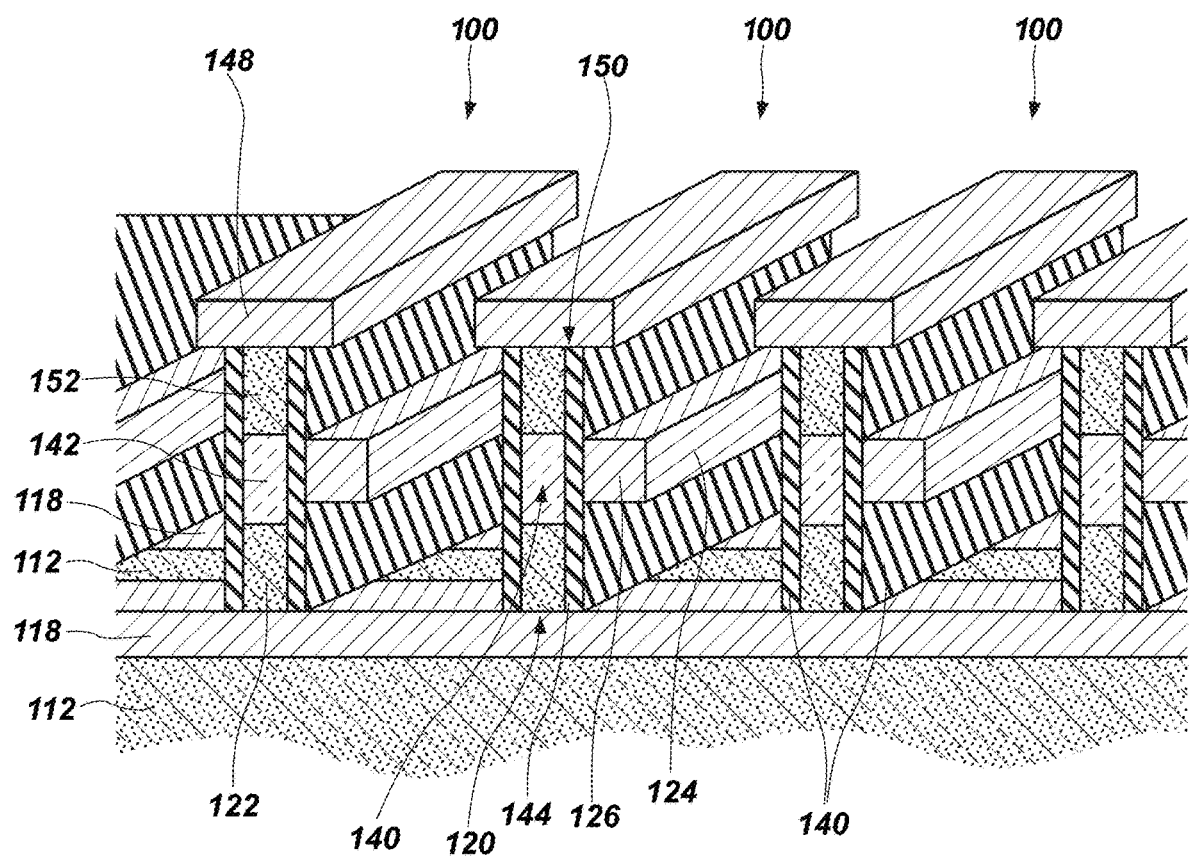
FIG. 4 is a perspective view of a schematic of an array according to an embodiment of the present disclosure.

In some embodiments, the second conductive material 148 may be provided in lines parallel with the third conductive material 124 of the gate electrode 126. The second conductive material 148 may be formed in aligned segments (for example, as shown in FIG. 4), as, for example, when more than one memory cell is to be formed of the second conductive material 148. Each aligned segment of the second conductive material 148 may be coupled to a drain region 150 of a separate memory cell. Segmentation of the second conductive material 148 may provide electrical isolation of each segment of second conductive material 148 from one another.

The third conductive material 124 of the gate electrode 126 may be formed from one metal, from a mixture of metals, or from layers of different metals. For example, without limitation, the third conductive material 124 of the gate electrode 126 may be formed of titanium nitride. A barrier material (not shown) may be provided between the gate electrode 126 and surrounding components. The third conductive material 124 forming the gate electrode 126 may be isolated from the first conductive material 118 by the first insulative material 160.

For embodiments in which the transistor 100 is incorporated within a memory structure such as a memory cell, a storage element (not shown) may be in operative communication with the transistor 100 to form the memory cell. The memory cell comprises an access transistor that comprises a source region, a drain region, and a channel region comprising different material types for the channel material relative to the source material and the drain material. The different material types may include different regions that are either lower bandgap higher mobility or higher bandgap lower mobility relative to each other. The memory cell further comprises a storage element in operative communication with the transistor. Different configurations of storage elements are contemplated as known by those skilled in the art. For example, storage elements (e.g., capacitors) may be configured as container structures, planar structures, etc. The access transistor enables a read and/or write operation of a charge stored in the storage element. The transistor 100 may be incorporated as an access transistor or other selector device within a memory device (e.g., a resistance variable memory device, such as a RRAM device, a CBRAM device, an MRAM device, a PCM memory device, a PCRAM device, a STTRAM device, an oxygen vacancy-based memory device, and/or a programmable conductor memory device), such as in a 3D cross-point memory array.

A method of operating the hybrid transistor is also disclosed. The method comprises enabling a hybrid transistor by applying a gate voltage to a gate electrode to cause a drive current to flow through a channel region coupled between a source region and a drain region, the channel region including a high bandgap low mobility material relative to the source region and drain region each including a low bandgap high mobility material.

In particular, the transistor 100 may be selectively turned to an "on" state (i.e., enabled) to allow current to pass through a first low bandgap high mobility material, the high bandgap low mobility material, and the second low bandgap high mobility material. The transistor 100 may also be selectively turned to an "off" state (i.e., disabled) to substantially stop current flow. When incorporated with a select device, enabling or disabling the transistor 100 may connect or disconnect to a desired structure. When incorporated as an access transistor, the transistor 100 may enable access to the storage element during a particular operation (e.g., read, write, etc.). However, current may "leak" from the storage element through the channel region 140 in the "off" state in the direction of arrow 146 and/or in other directions. Refreshing the memory cell may include reading and recharging each memory cell to restore the storage element to a charge corresponding to the appropriate binary value (e.g., 0 or 1).

As shown in FIGS. 1A and 1B, the materials 122, 142, 152 are shown as three distinct regions that alternate between a lower bandgap higher mobility material (e.g., source material 122, drain material 152) and a higher bandgap lower mobility material (e.g., channel material 142). Other configurations are also contemplated. For example, the channel region 140 may include additional regions that are more than three. For example, as shown in FIG. 2, the channel region 140 may include channel materials 142A, 142B, 142C that may alternate between a higher bandgap lower mobility material (e.g., 142A, 142C) and a lower bandgap higher mobility material (e.g., 142B).

Figure 2:
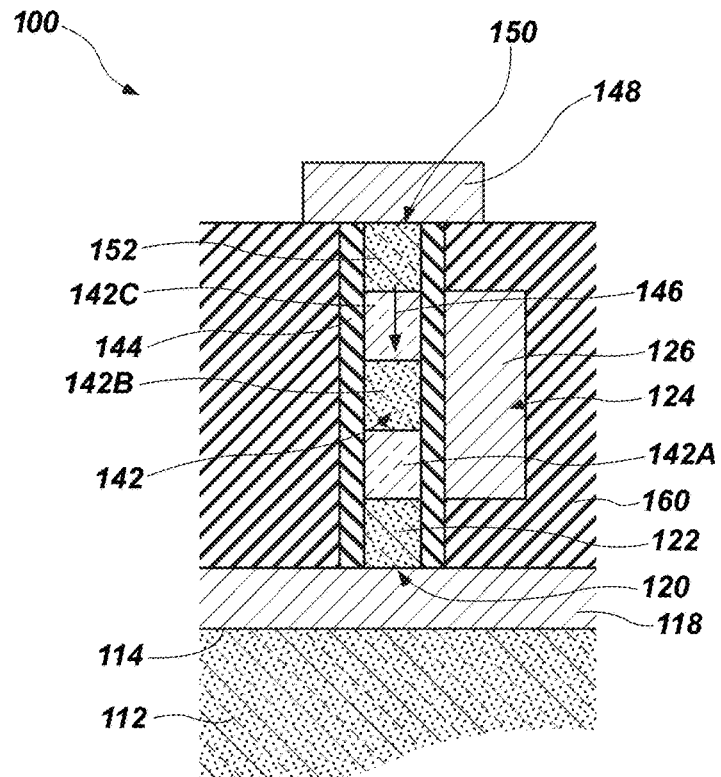
FIGS. 2 and 3 are cross-sectional front views of a schematic of vertical thin film transistor according to various embodiments of the present disclosure.
Figure 3:
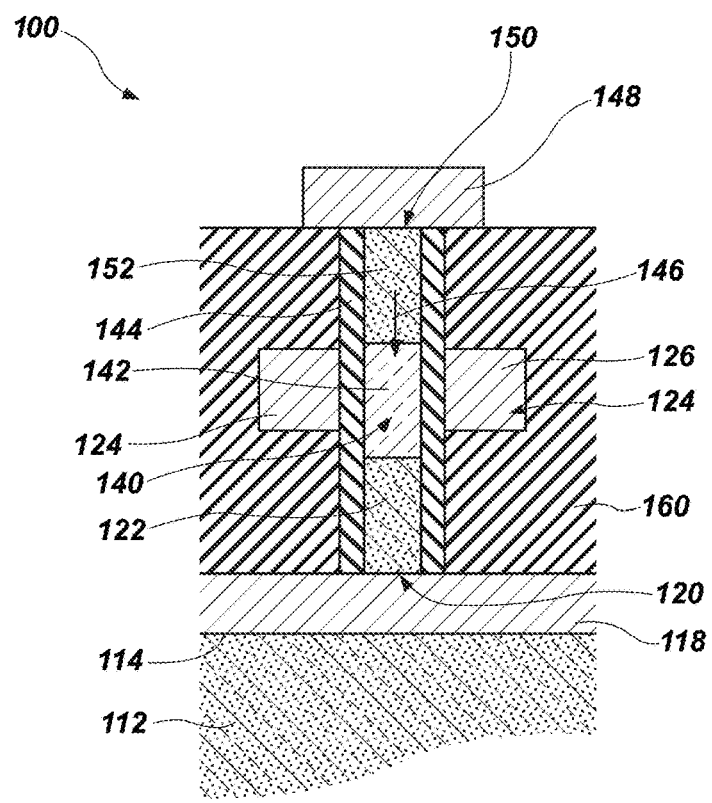

As shown in FIGS. 1A, 1B, and 2, the gate electrode 126 may include a single-side gate passing along one of the sidewalls of the channel material 142. Other configurations are also contemplated. For example, as shown in FIG. 3, the gate electrode 126 may include a dual-sided gate with electrodes provided along at least a part of each of the sidewalls of the channel material 142. In some embodiments, the gate electrode 126 may include a tri-sided gate with electrodes provided along at least a part of each of the sidewalls and front wall or rear wall of the channel material 142. Therefore, the gate electrode 126 may be configured as a "U" gate. In still other embodiments, the gate electrode 126 may include a surround gate conformally covering each of the sidewalls, front wall, and rear wall of the channel material 142. In still other embodiments, the gate electrode 126 may include a ring gate surrounding only a portion of each of the sidewalls, front wall, and rear wall of the channel material 142. Forming the various configurations of the gate electrode 126 may be achieved according to techniques known in the art. Therefore, details for forming these other configurations are not provided herein.

FIG. 4 is a perspective view of a schematic of transistors 100 having multiple types of materials 122, 142, 152 as discussed above. The transistors 100 may be utilized as access transistors for corresponding memory cells of a memory array according to an embodiment of the present disclosure. As such, the transistors 100 may be coupled to a corresponding storage element (not shown) to form a memory cell. As discussed above, various configurations of storage elements are contemplated as would be apparent to those of ordinary skill in the art. Each memory cell defines a cell area according to the dimensions of its sides. Each side may have a cell side dimension. The cell may have equal width and length cell side dimensions. The dimensions of the capacitor of each memory cell may be relatively small and the memory cells densely packed relative to one another. In some embodiments, cell side dimension of each memory cell of the present disclosure may be substantially equal to or less than 2F, where F is known in the art as the smallest feature size capable of fabrication by conventional fabrication techniques. Therefore, the cell area of each memory cell may be substantially equal to $4F^2$.

Such a memory array may include memory cells aligned in rows and columns in the same horizontal plane. The first conductive material 118 forming the source region 120 of each transistor 100 may be arranged perpendicular to the stacked materials 122, 142, 152 for each transistor 100. Likewise, the second conductive material 148 forming the drain contact for each transistor 100 may be arranged perpendicular to the stacked materials 122, 142, 152 of each transistor 100. The second insulative material 144 and the gate electrodes 126 may be arranged in parallel to the channel material 142 and perpendicular to the first conductive material 118 and the second conductive material 148. Multiple memory cells within a particular row may be in operative communication with the same gate electrode 126, second insulative material 144, and channel material 142. Therefore, for example, a gate electrode 126 in operative communication with the channel region 140 of a first memory cell may also be in operative communication with the channel region 140 of a second memory cell neighboring the first memory cell. Correspondingly, multiple memory cells within a particular column may be in operative communication with the same first conductive material 118 and second conductive material 148.

A method of forming a semiconductor device is disclosed. The method comprises forming a hybrid transistor supported by a substrate comprising forming a source including a first low bandgap high mobility material, forming a channel including a high bandgap low mobility material coupled with the first low bandgap high mobility material, forming a drain including a second low bandgap high mobility material coupled with the a high bandgap low mobility material, and forming a gate separated from the channel via a gate oxide material.

FIGS. 5A through 5J depict various stages of a fabrication process according to the disclosed embodiment of a method of forming a memory cell. The method may result in the fabrication of a transistor 100 such as that discussed above and depicted in FIGS. 1A and 1B.

Figure 5A:
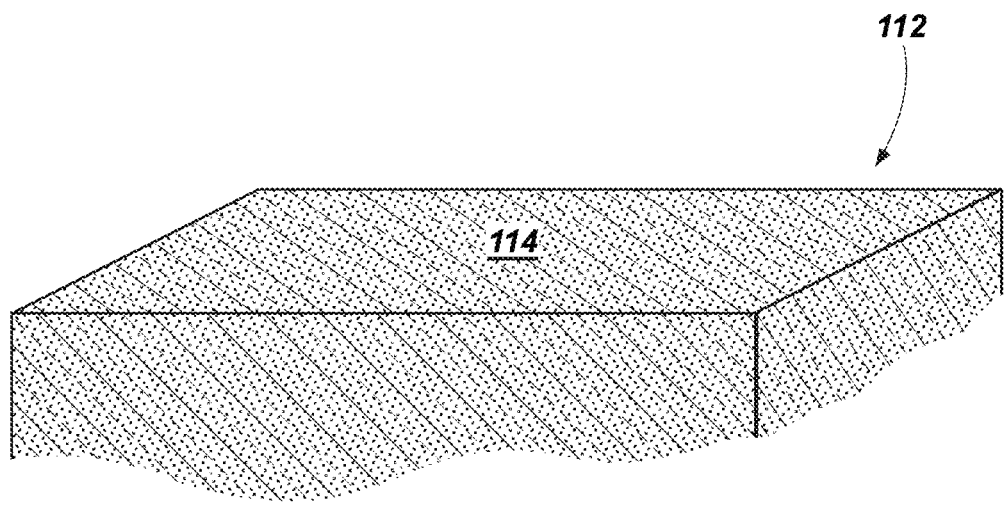
FIGS. 5A through 5J depict various stages of a fabrication process according to the disclosed embodiment of a method of forming a thin film transistor.

With particular reference to FIG. 5A, the method may include forming a substrate 112 having a primary surface 114. The substrate 112, or at least the primary surface 114, may be formed of a semiconductor material (e.g., silicon) or other material as known in the art.

Figure 5B:
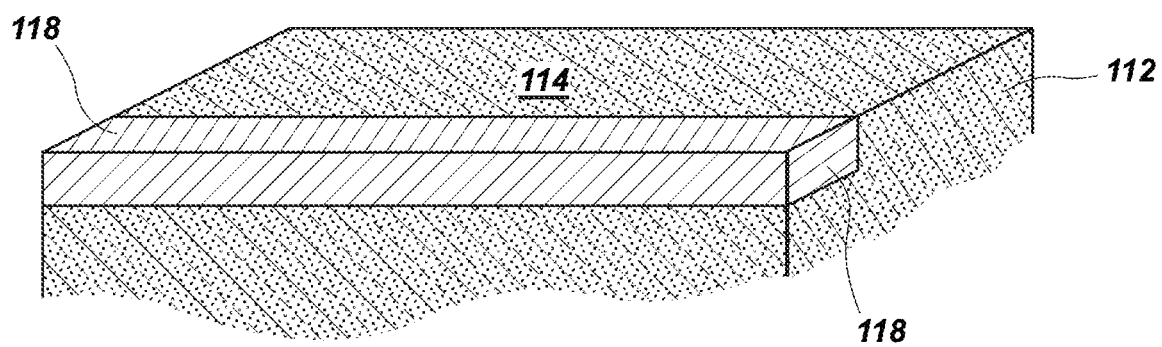

With reference to FIG. 5B, the method includes forming a first conductive material 118 supported by the substrate 112. The first conductive material 118 may be formed in a continuous layer covering the primary surface 114 of the substrate 112, as shown in FIG. 1B. The first conductive material 118 may alternatively be formed as an elongated line on or within the substrate 112, as shown in FIG. 5B. Elongated lines of the first conductive material 118 may be conducive for inclusion in embodiments that include a memory cell within an array of aligned memory cells. As such, the first conductive material 118 of one memory cell may extend to other memory cells in a particular row or column. A plurality of aligned elongated lines of the first conductive material 118 may be arranged in parallel and be separated from one another by a portion of the substrate 112.

As illustrated in FIG. 5B, the first conductive material 118 is formed as a line of metal within the substrate 112 such that a top surface of the first conductive material 118 is aligned with the plane defined by the primary surface 114 of the substrate 112. In some embodiments, the method may include etching a trench into the substrate 112 and depositing the first conductive material 118 within the trench. Forming the first conductive material 118 may further include planarizing the top surfaces of the first conductive material 118 and the primary surface 114 of the substrate 112 or planarizing just the top surface of the first conductive material 118. Planarizing the first conductive material 118 and substrate 112 may include abrasive planarization, chemical mechanical polishing or planarization (CMP), an etching process, or other known methods.

Figure 5C:
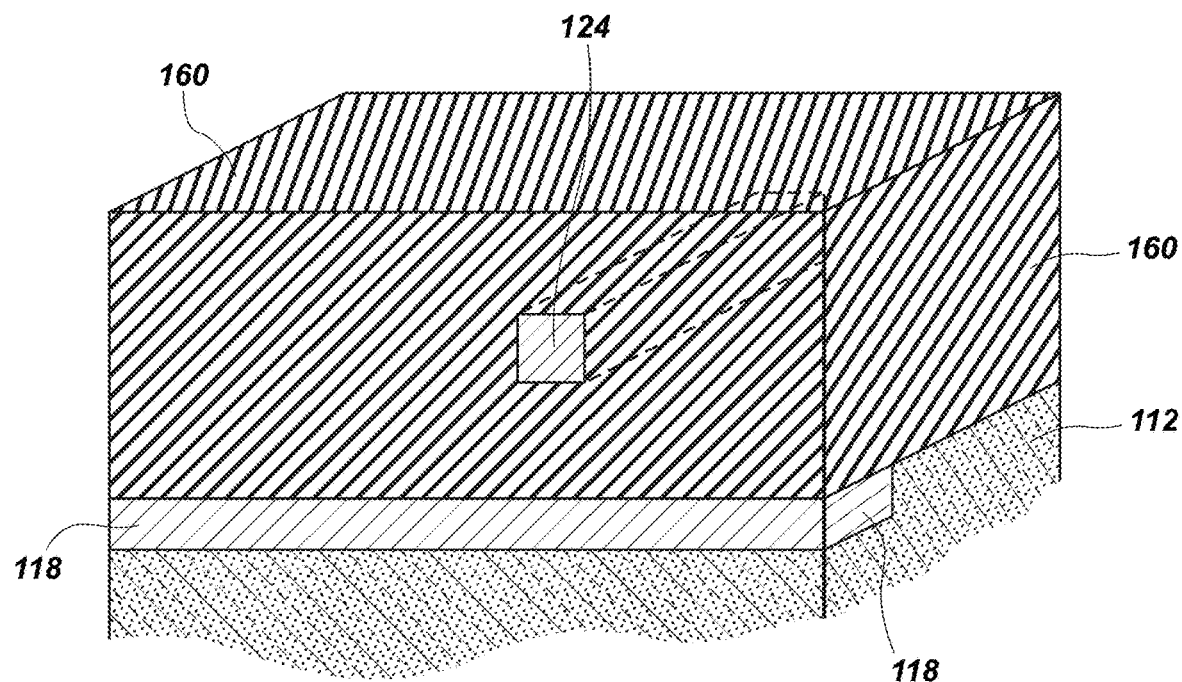

With reference to FIG. 5C, the present method further includes forming a third conductive material 124 isolated from the first conductive material 118. Forming the third conductive material 124 isolated from the first conductive material 118 may include forming the third conductive material 124 such that the third conductive material 124 appears to be floating within a first insulative material 160. These techniques may include depositing a first amount of first insulative material 160, forming the third conductive material 124 on or in the top surface of the first deposited amount of first insulative material 160, and applying a second amount of first insulative material 160 to cover the third conductive material 124. It may further include planarizing the top surface of the second amount of first insulative material 160. Planarizing the top surface of the second amount of first insulative material 160 may be accomplished with any of the aforementioned planarizing techniques or another appropriate technique selected by one having ordinary skill in the art.

Figure 5D:
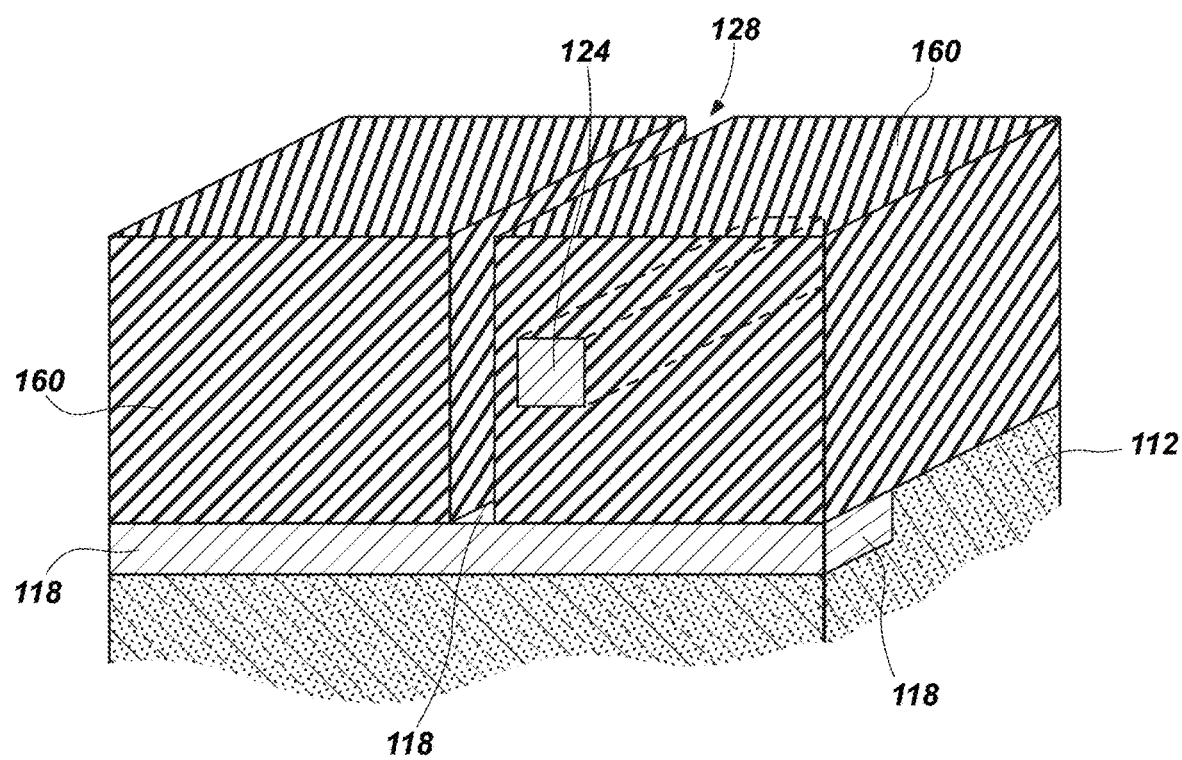
Figure 5E:
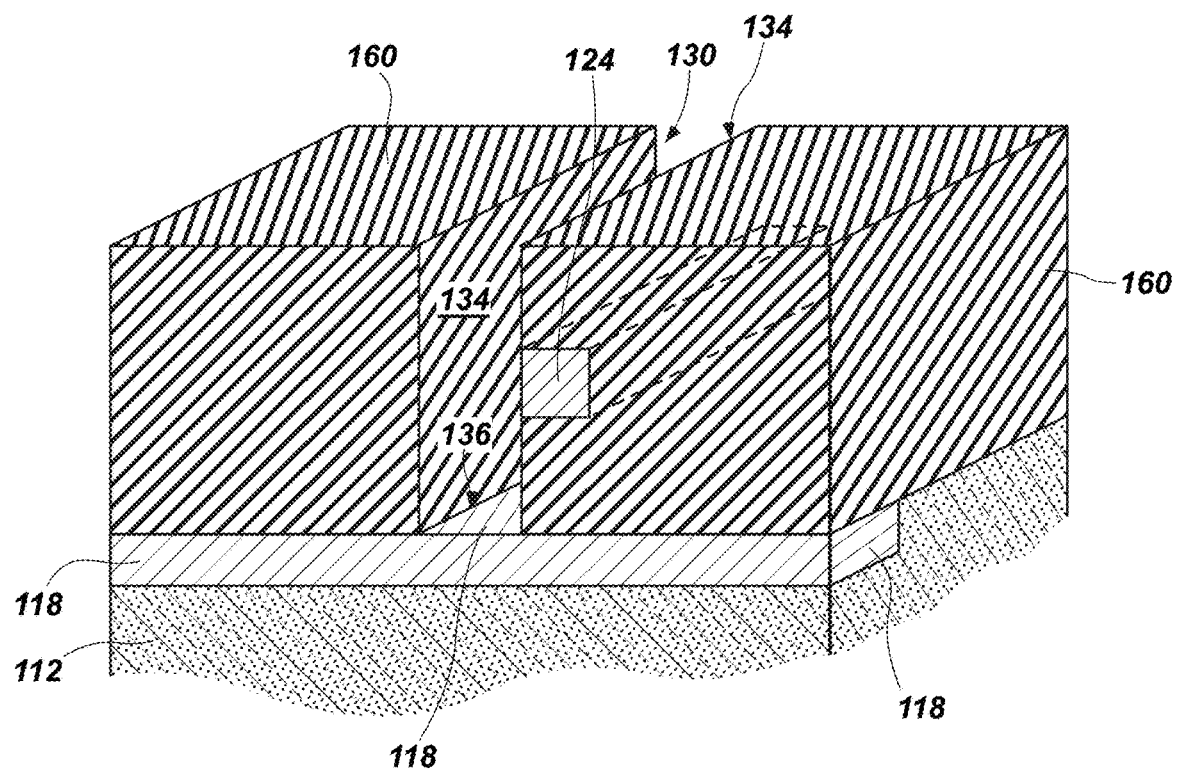

With reference to FIGS. 5D and 5E, the present method further includes forming an opening bordered at least in part by portions of the first conductive material 118 and the third conductive material 124. Forming such an opening may be accomplished in one or more stages. The opening may be formed by forming a first opening 128 to expose a portion of the first conductive material 118, as shown in FIG. 2D, and then by forming a second opening 130 to also expose a portion of the third conductive material 124, as shown in FIG. 2E. Alternatively, the opening may be formed by exposing both the first conductive material 118 and the third conductive material 124 in one step. Selecting and implementing the appropriate technique or techniques to form the opening exposing a portion of the first conductive material 118 and the third conductive material 124 may be understood by those of skill in the art. These techniques may include isotropically etching the first insulative material 160 to form first opening 128 to contact a portion of the first conductive material 118. The techniques may further include anisotropically etching the first insulative material 160 to expand the width of the previously-formed first opening 128 until a portion of the third conductive material 124 is also exposed, thus forming the second opening 130. For example, without limitation, the second opening 130 may be formed using a reactive ion etch process.

Due to the use of such techniques to form the opening bordered at least in part by the first conductive material 118 and the third conductive material 124, the third conductive material 124 may be offset from the positioning of the first conductive material 118. That is, in some embodiments, the third conductive material 124 may be formed in exact alignment with the first conductive material 118 such that the horizontal sides of the first conductive material 118 align vertically with the horizontal sides of the third conductive material 124. In such an embodiment, the third conductive material 124 may completely overlap and align with the first conductive material 118. In other embodiments, one of the third conductive material 124 and the first conductive material 118 may completely overlap the other such that vertical planes perpendicular to the primary surface 114 of the substrate 112 passing through one of the materials 124, 118 intersects with the other materials 118, 124. In other embodiments, the third conductive material 124 may be formed to partially overlap the first conductive material 118 such that at least a portion of both the first conductive material 118 and the third conductive material 124 occupy space in a vertical plane perpendicular to the primary surface 114 of the substrate 112. In still other embodiments, the third conductive material 124 may be completely offset from the first conductive material 118 such that no vertical plane perpendicular to the primary surface 114 of the substrate 112 intersects both the first conductive material 118 and the third conductive material 124. Regardless of the overlapping or non-overlapping positions of the first conductive material 118 and the third conductive material 124, in forming the second opening 130, at least a portion of the first conductive material 118 is exposed and at least a portion of the third conductive material 124 is exposed.

According to the depicted embodiment, the formed second opening 130 is bordered at least in part along a bottom 136 of second opening 130 by an upper portion of the first conductive material 118 and is bordered at least in part along one of sidewalls 134 of the second opening 130 by a side portion of third conductive material 124. In embodiments involving a single-sided gate electrode 126, the second opening 130 may be formed by forming a trench through first insulative material 160 to expose at least a portion of first conductive material 118 and third conductive material 124. In other embodiments, such as those in which the gate electrode 126 is a dual-sided gate, a surround gate, a ring gate, or a "U" gate, forming the second opening 130 may include removing central portions of the third conductive material 124 to form the second opening 130 passing through the third conductive material 124. Such second opening 130 may be bordered in part along the bottom 136 of second opening 130 by an upper portion of the first conductive material 118 and bordered along multiple sidewalls 134 by side portions of the third conductive material 124.

Figure 5F:
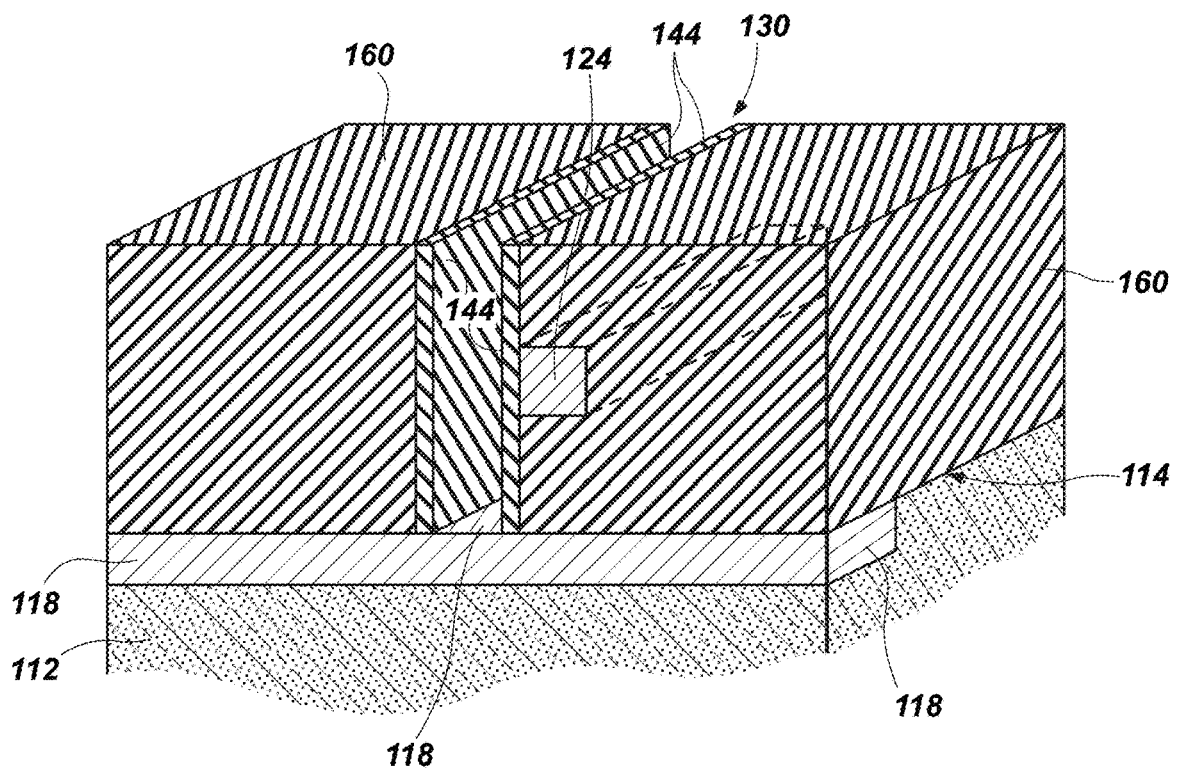

With reference to FIG. 5F, the method includes forming a second insulative material 144 on the sidewalls 134 of the formed second opening 130. The second insulative material 144 may be formed of a dielectric material, such as an oxide. The second insulative material 144 may be formed by depositing the material conformally on the sidewalls 134. For example, without limitation, the second insulative material 144 may be formed by atomic layer deposition (ALD). Selecting and implementing an appropriate technique to form the second insulative material 144 on the sidewalls 134 of the second opening 130 may be understood by those of skill in the art. Forming the second insulative material 144 along the sidewalls 134 of the second opening 130 may reduce the width of second opening 130, forming a slightly narrower second opening 130.

Forming the second insulative material 144 may include forming the second insulative material 144 not only on the sidewalls 134 of the second opening 130, but also on the exposed surfaces of the third conductive material 124. A material-removing technique, such as a conventional spacer etching technique, may be used to remove the second insulative material 144 covering the upper surface of the first conductive material 118, while leaving third conductive material 124 covered by second insulative material 144.

Figure 5G:
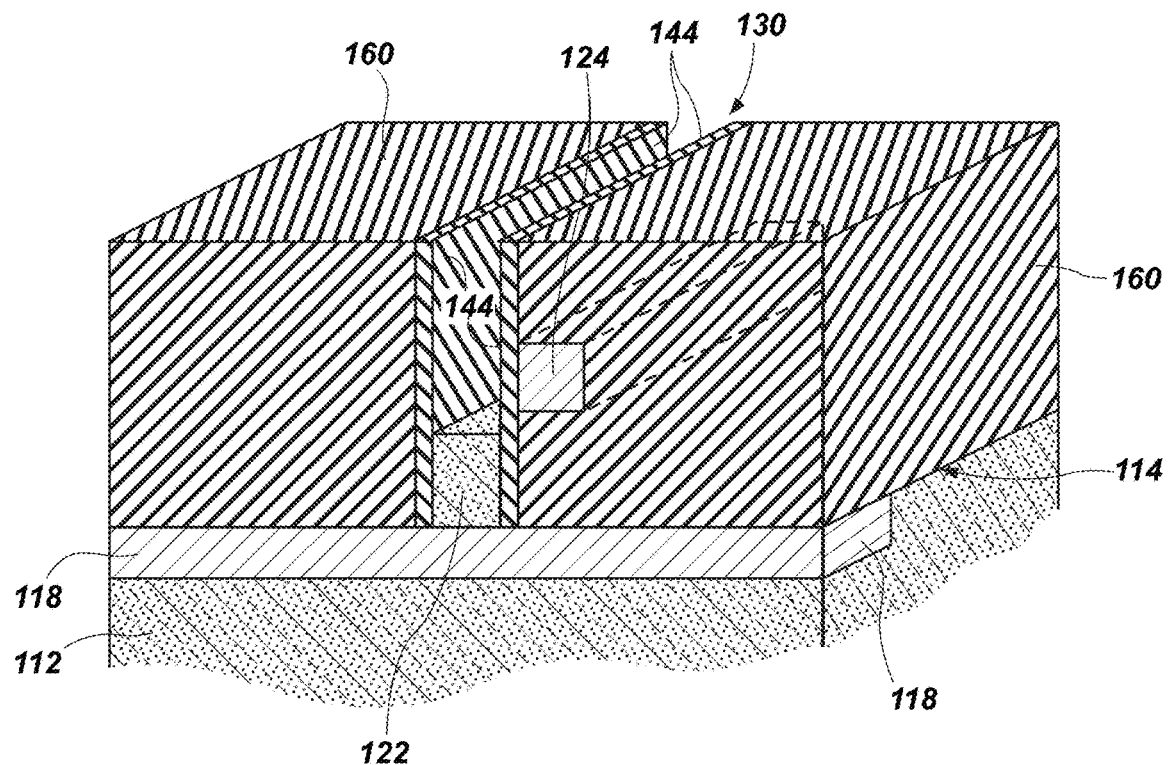
Figure 5H:
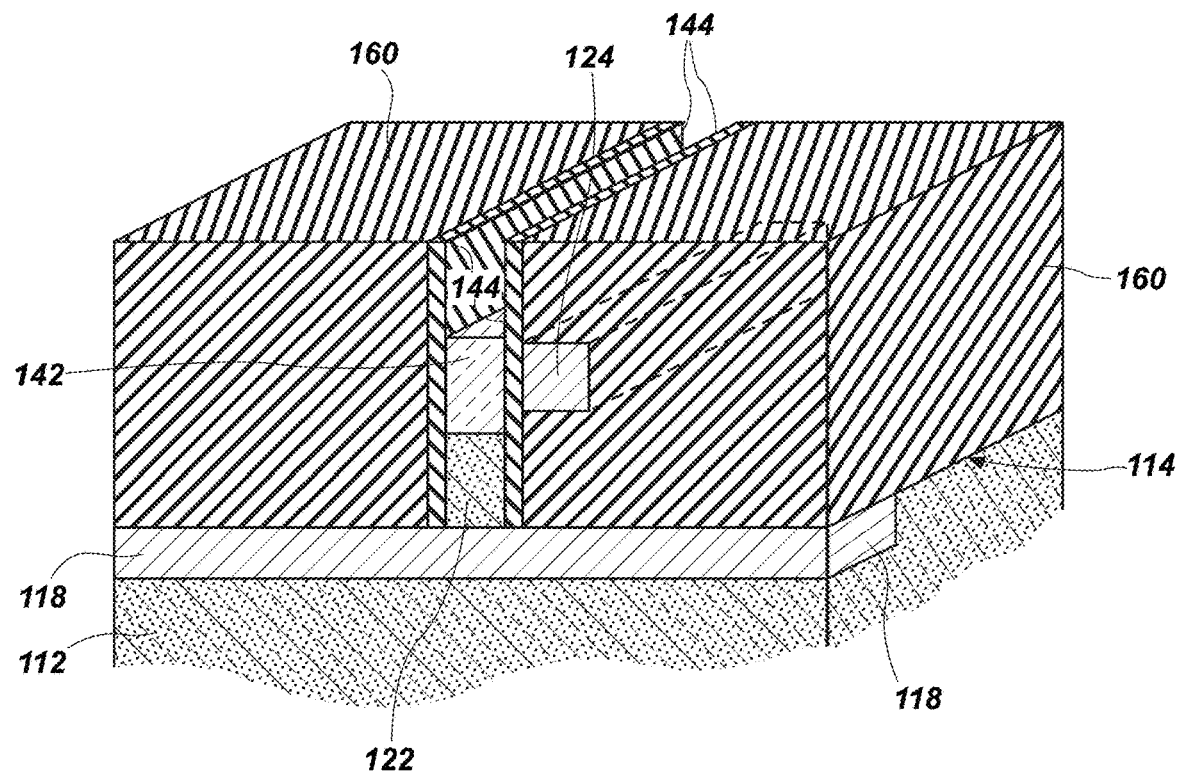
Figure 5I:
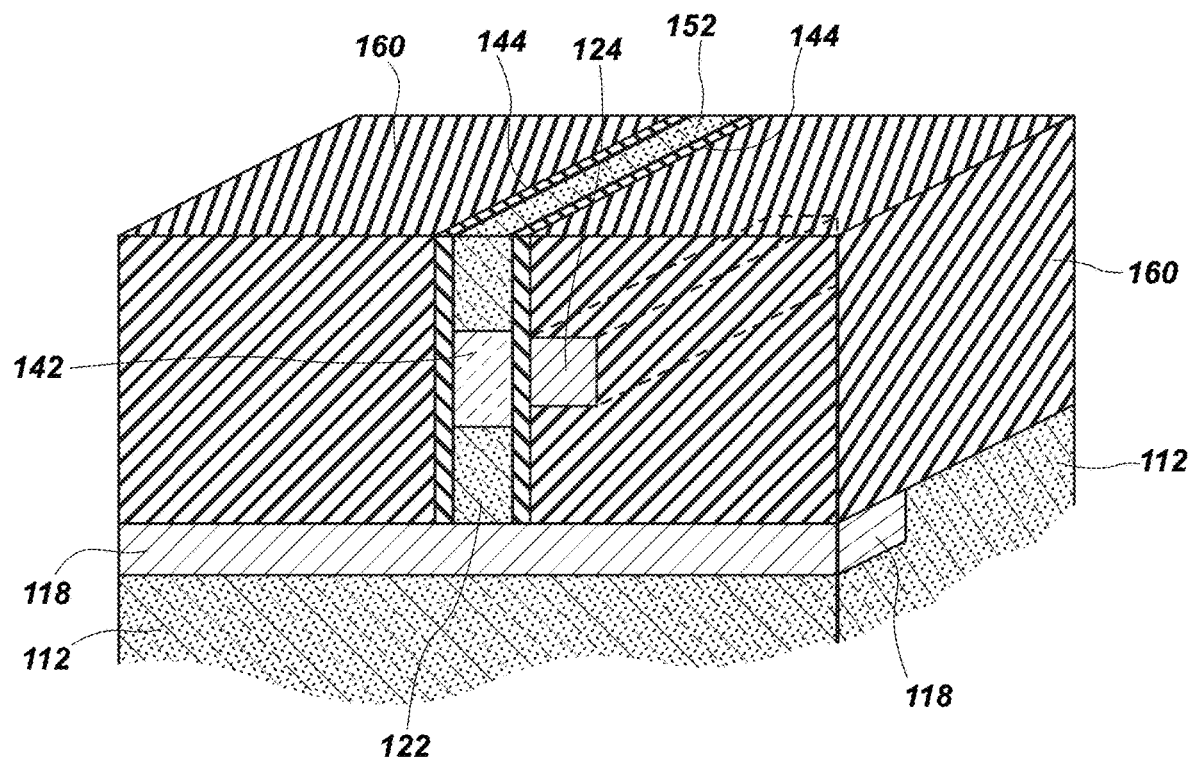

With reference to FIGS. 5G through 5I, second opening 130 is filled with materials for the source material 122 (FIG. 5G), the channel material 142 (FIG. 5H), and the drain material 152 (FIG. 5I) that form a hybrid transistor including different types of materials exhibiting different bandgap and mobility properties. In some embodiments, the source material 122 and the drain material 152 may be of the same material type whereas the second channel material 142 is of a different material type.

As a non-limiting example, the source material 122 and the drain material 152 may be formed from a lower bandgap higher mobility material, and the channel material 142 may be formed from a higher bandgap lower mobility material. For example, without limitation, the second opening 130 may be filled with a doped semiconductor material (e.g., N doped) to form the source material 122 disposed on the first conductive material 118 (see FIG. 5G). The second opening 130 may then be filled with an oxide semiconductor material to form the channel material 142 disposed on the source material 122 (see FIG. 5H). The second opening 130 may then be filled with a doped semiconductor material (e.g., N doped) to form the drain material 152 disposed on the channel material 142. Conventional techniques for forming the other components of the transistor 100 (e.g., the first conductive material 118, the third conductive material 124, and the second insulative material 144) at fabrication temperatures less than 800 degrees Celsius are known in the art. Such techniques may require, for example, fabrication temperatures less than 650 degrees Celsius (e.g., temperatures in the range of 200 to 600 degrees Celsius). The method may also include planarizing the upper surface of the first insulative material 160, the second insulative material 144, and the drain material 152. Planarizing these upper surfaces may be accomplished using any planarization technique.

Figure 5J:
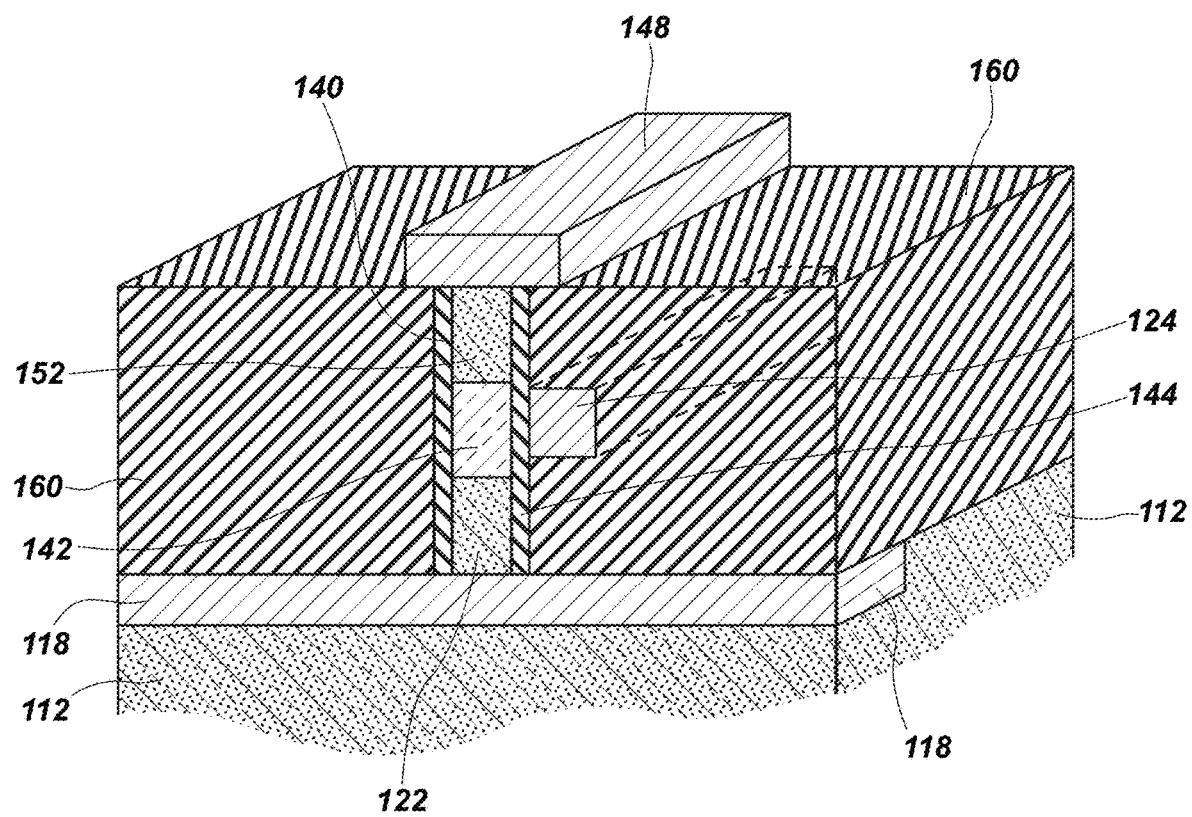

With reference to FIG. 5J, the method further includes forming the second conductive material 148 atop and in contact with the drain material 152. When further forming a memory cell, a storage element (e.g., capacitor) may also be formed over the second conductive material 148 to form a memory cell according to the various configurations of storage elements known by those of ordinary skill in the art.

In some embodiments, forming the transistor may include a gate last flow formation in which the stack of films comprising the drain, channel, and source materials are deposited, etched first to form lines, filled and etched again in perpendicular direction to form a pillar followed by gate-oxide and gate metal. Other methods of forming the transistor are further contemplated as known by those of ordinary skill in the art.

Figure 6:
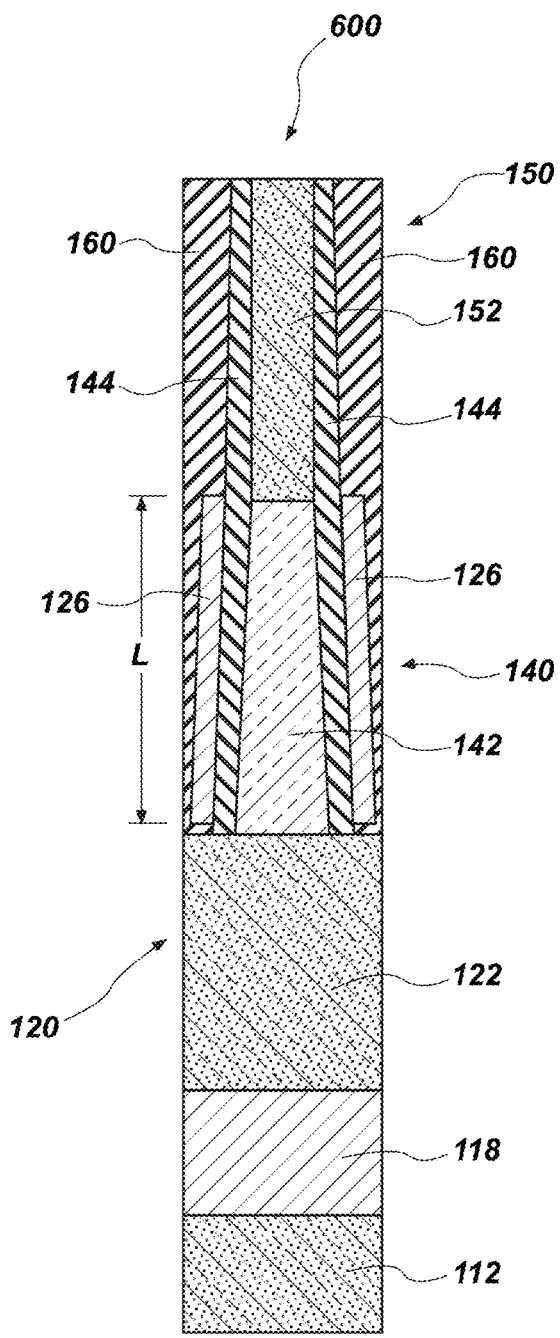
FIGS. 6 and 7 are cross-sectional front views of a schematic of transistors configured in a vertical configuration according to additional embodiments of the present disclosure.
Figure 7:
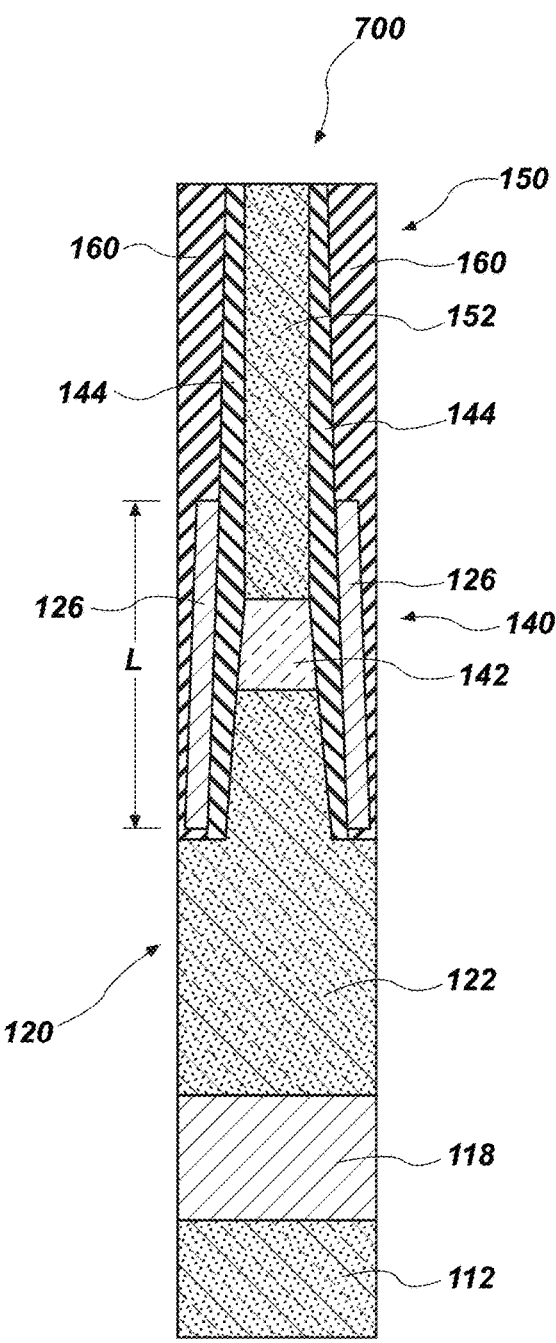

FIGS. 6 and 7 are cross-sectional front views of a schematic of transistors configured in a vertical configuration according to additional embodiments of the present disclosure. The construction of the vertical hybrid transistors 600, 700 is generally similar to that of FIG. 1A in that a source material 122, a channel material 142, and a drain material 152 of different types may be stacked in a vertical direction relative to a substrate 112 and first conductive material 118. In FIG. 6, however, the channel material 142 of the vertical hybrid transistor 600 may have a wide base that tapers from the top of the source material 122 to the bottom of the drain material 152. In addition, the channel material 142 may extend vertically for the entire channel length L defined by the length of the gate electrode 126. The gate electrode 126 may be slightly angled to accommodate this tapering. In FIG. 7, the source material 122 and the drain material 152 may extend into the channel region defined by the length of the gate electrode 126. As a result, at least a portion of the source material 122 may extend above the bottom of the gate electrode 126, and at least a portion of the drain material 152 may extend below the top of the gate electrode 126. Thus, the channel region 140 defined by length of the gate electrode 126 may be a hybrid channel that include different material types (e.g., low mobility and high mobility materials). The lengths of these different materials 122, 142, 152 within the channel region 140 may be selected for tuning other device metrics (e.g., DIBL, SVTM etc.) as desired. The formation of such a tapered channel region may be performed as known by those of ordinary skill in the art. In some embodiments, the bandgap from the channel material 142 to the source and drain materials 122, 152 may be uniformly graded. In some embodiments, the doping of the source and drain materials 122, 152 may be non-uniform. For example, the portion of the source and drain materials 122, 152 overlapping with the gate electrode 126 within the channel length L may have a lower doping concentration relative to the higher doping concentration of the source and drain materials 122, 152 in the portions outside of the area of the gate electrode 126.

Figure 8:
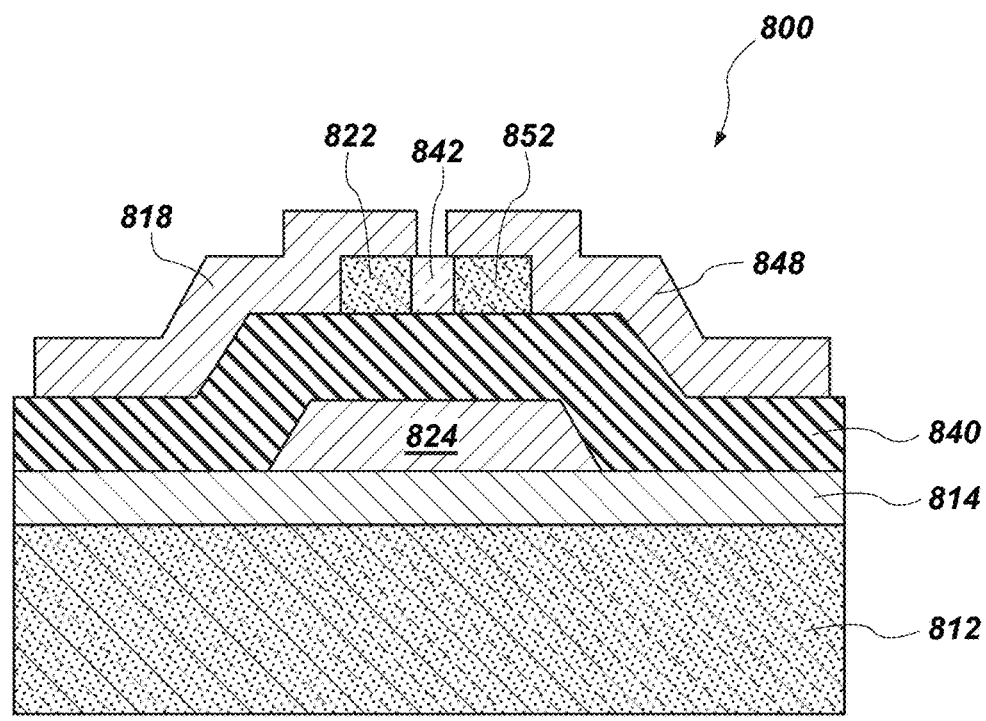
FIGS. 8 and 9 are cross-sectional front views of a schematic of transistors configured in a planar configuration according to additional embodiments of the present disclosure.
Figure 9:
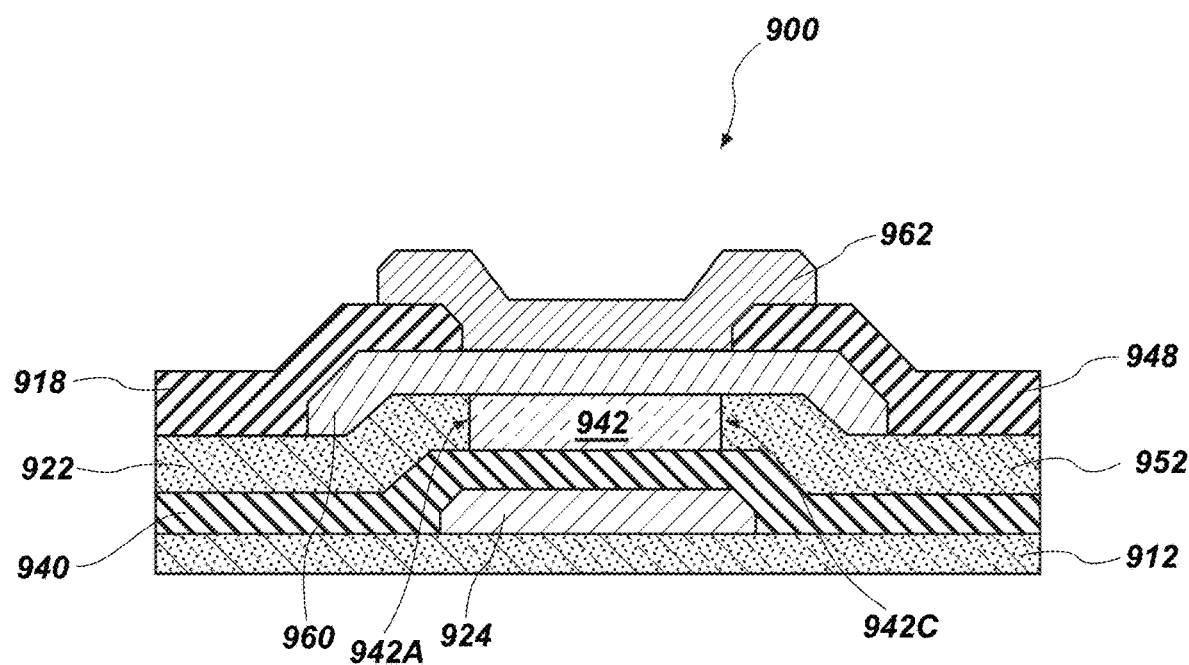

In some embodiments the memory cell may be structured to include a planar access transistor (i.e., also referred to as a horizontal access transistor). FIG. 8 and FIG. 9 show non-limiting examples of such planar access transistors according to additional embodiments of the present disclosure.

Referring to FIG. 8, the transistor 800 may include a substrate 812 upon which the transistor 800 is supported. A gate electrode 824 may be disposed on the substrate 812. In some embodiments, an additional material 814 (e.g., a silicon oxide material) may be disposed between the conductive material for the gate electrode 824 and the substrate 812. A gate oxide material 840 may be formed over the gate electrode 824 including around the side walls of the gate electrode 824. The source material 822, channel material 842, and drain material 852 may be formed on the gate oxide material 840, and be coupled with a first conductive material 818 as a source contact, and with a second conductive material 848 as a drain contact. The materials 822, 842, 852 may be formed from different material types to form a hybrid transistor as discussed above.

As shown in FIG. 8, the combined materials 822, 842, 852 may have a shorter width than the gate oxide material 840, and the first conductive material 818 and the second conductive material 848 may each surround at least two sides of the channel material 842. The materials 822, 842, 852 may be disposed proximate the inner ends of their respective conductive materials 818, 848.

Referring to FIG. 9, the transistor 900 may include a substrate 912, a gate electrode 924, a gate oxide 940, and a source material 922, channel material 942, and drain material 952 stacked similarly as in FIG. 8. One difference between the embodiments of FIGS. 8 and 9 is that the combined materials 922, 942, 952 and the gate oxide 940 may be substantially coextensive in length. In addition, the first conductive material 918 and the second conductive material 948 may be disposed on only the top side of the channel material 942, and proximate the respective outer ends 942A, 942C of the channel material 942. The transistor 900 may further include additional materials, such as an etch stop material 960 and a passivation material 962 formed over the channel material 942. Other configurations of horizontal transistors are also contemplated including top gate or bottom gate configurations.

Figure 10A:
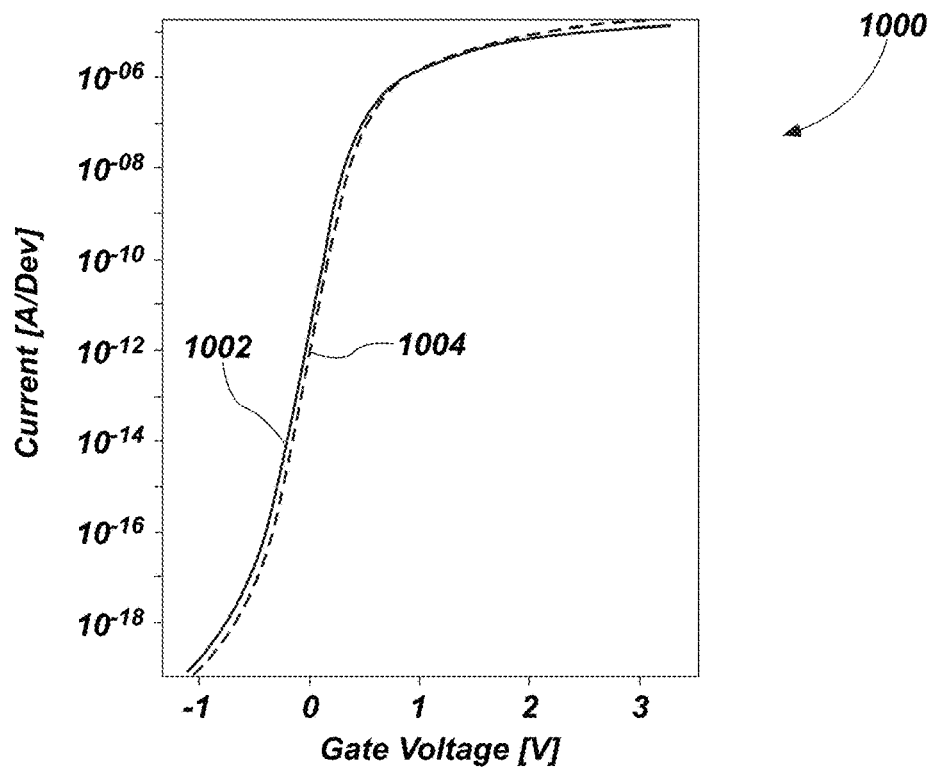
FIG. 10A and FIG. 10B are graphs illustrating the drive current $I_D$ for a transistor when applying various gate voltages.
Figure 10B:
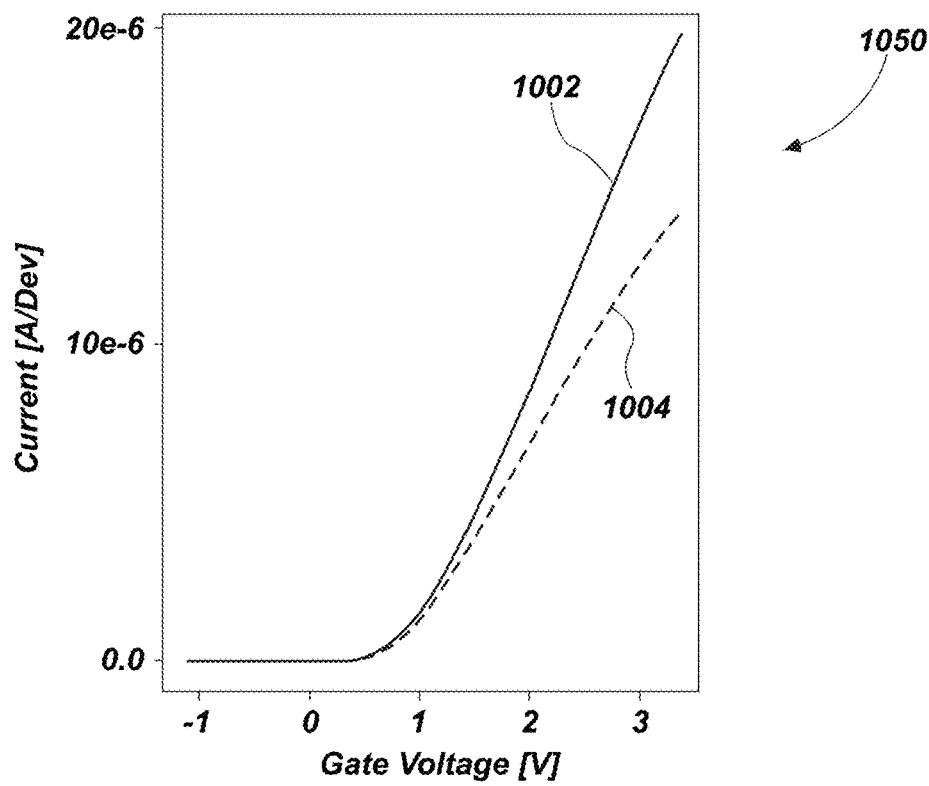

FIG. 10A and FIG. 10B are graphs illustrating the drive current ($I_D$) for a transistor when applying various gate voltages. In particular, graph 1050 of FIG. 10B is a zoomed-in, enlarged view of a portion of the graph 1000 of FIG. 10A. Line 1002 shows the drive current $I_D$ resulting from different gate voltages ($V_G$) for a hybrid transistor according to embodiments of the disclosure. Line 1004 shows the drive current ($I_D$) resulting from different gate voltages ($V_G$) for a conventional transistor having a uniform channel between conductive contacts. As shown in FIGS. 10A and 10B, the off current ($I_{OFF}=I_D$ when $V_G$ is less than zero) for line 1002 is similar to line 1004, but that the on current ($ION=I_D$ when $V_G$ is greater than zero) is increased in comparison to line 1004. Thus, the hybrid transistor may combine the advantage of having a high on current ($I_{ON}$) and low off current ($I_{OFF}$) relative to conventional devices.

A semiconductor device is also disclosed. The semiconductor device comprises a dynamic random access memory (DRAM) array comprising DRAM cells that each comprise a hybrid access transistor and a storage element operably coupled with the hybrid access transistor configured as discussed above.

Figure 11:
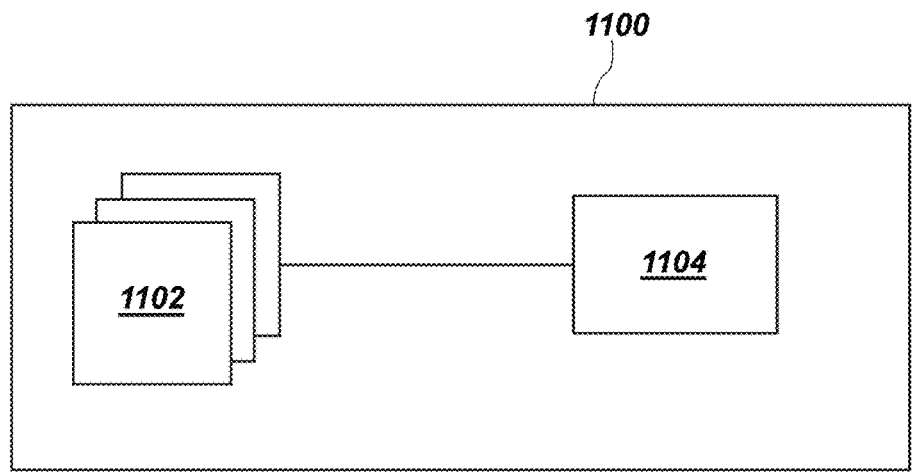
FIG. 11 is a simplified block diagram of a semiconductor device including a memory array of one or more embodiments described herein.

FIG. 11 is a simplified block diagram of a semiconductor device 1100 implemented according to one or more embodiments described herein. The semiconductor device 1100 includes a memory array 1102 and a control logic component 1104. The memory array 1102 may include memory cells as described above. The control logic component 1104 may be operatively coupled with the memory array 1102 so as to read, write, or re-fresh any or all memory cells within the memory array 1102. Accordingly, a semiconductor device comprising a dynamic random access memory (DRAM) array is disclosed. The DRAM array comprises a plurality of DRAM cells. Each DRAM cell of the plurality comprises a hybrid access transistor having a channel region comprising an oxide semiconductor material and one or more source or drain regions comprising a doped semiconductor material as discussed above.

A system is also disclosed. The system comprises a memory array of memory cells. Each memory cell may comprise an access transistor and a storage element operably coupled with the transistor. The access transistor may be configured as discussed above.

Figure 12:
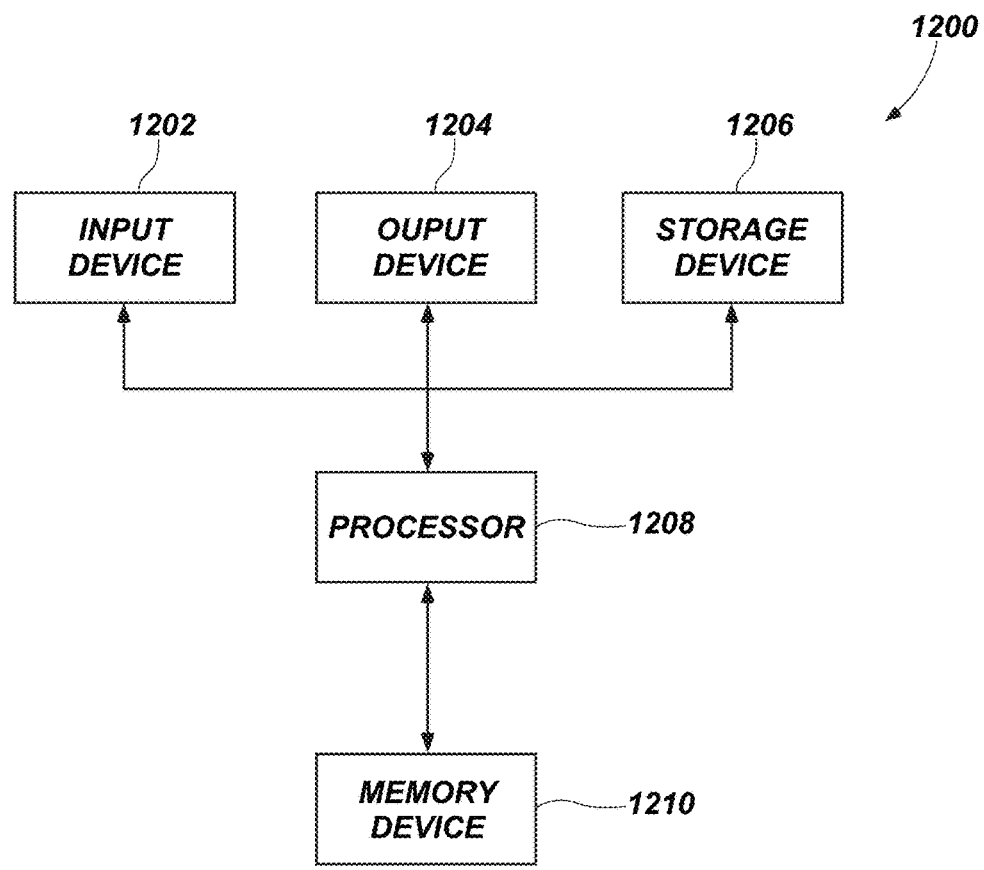
FIG. 12 is a simplified block diagram of a system implemented according to one or more embodiments described herein.

FIG. 12 is a simplified block diagram of an electronic system 1200 implemented according to one or more embodiments described herein. The electronic system 1200 includes at least one input device 1202. The input device 1202 may be a keyboard, a mouse, or a touch screen. The electronic system 1200 further includes at least one output device 1204. The output device 1204 may be a monitor, touch screen, or speaker. The input device 1202 and the output device 1204 are not necessarily separable from one another. The electronic system 1200 further includes a storage device 1206. The input device 1202, output device 1204, and storage device 1206 are coupled to a processor 1208. The electronic system 1200 further includes a memory device 1210 coupled to the processor 1208. The memory device 1210 includes at least one memory cell according to one or more embodiments described herein. The memory device 1210 may include an array of memory cells. The electronic system 1200 may include a computing, processing, industrial, or consumer product. For example, without limitation, the electronic system 1200 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A method of forming a semiconductor device, the method comprising:
   forming a hybrid transistor supported by a substrate comprising:
      forming a source including a first low bandgap high mobility material;
      forming a channel including a high bandgap low mobility material coupled with the first low bandgap high mobility material;
      forming a drain including a second low bandgap high mobility material coupled with the high bandgap low mobility material; and
      forming a gate separated from the channel via a gate oxide material,
      wherein forming the channel includes forming the high bandgap low mobility material to have a length that is shorter than a length of the gate.

2. The method of claim 1, wherein forming the hybrid transistor supported by the substrate includes forming a vertically configured transistor including forming the source, the channel, and the drain stacked on the substrate in a vertical orientation.

3. The method of claim 1, wherein forming the hybrid transistor supported by the substrate includes forming a horizontally configured transistor including forming the source, the channel, and the drain on the substrate in a horizontal orientation.

4. The method of claim 1, wherein the first low bandgap high mobility material is a first doped semiconductor material, the second low bandgap high mobility material is a second doped semiconductor material, and the high bandgap low mobility material is an oxide semiconductor material.

5. The method of claim 4, wherein the gate oxide material includes SiO2, a high-K material, or a combination thereof.

6. A method of forming a transistor, the method comprising:
   forming a source region including at least a first low bandgap high mobility material;
   forming a channel region including at least a high bandgap low mobility material adjacent the first low bandgap high mobility material; and
   forming a drain region including at least a second low bandgap high mobility material adjacent the high bandgap low mobility material,
   wherein forming the channel region further comprises forming the channel region including a third low bandgap high mobility material.

7. The method of claim 6, further comprising forming a gate electrode isolated from the channel region via a gate oxide material comprising SiO2, a high-K material, or a combination thereof.

8. The method of claim 7, wherein forming the channel region includes forming the high bandgap low mobility material having a length that is shorter than a length of the gate electrode.

9. The method of claim 7, wherein forming the gate electrode comprises forming one of a single gate electrode and a dual gate electrode.

10. The method of claim 6, wherein:
   forming the source region including at least the first low bandgap high mobility material comprises forming the source region including a first doped semiconductor material;
   forming the drain region including at least the second low bandgap high mobility material comprises forming the drain region including a second doped semiconductor material; and
   forming the channel region including at least the high bandgap low mobility material comprises forming the channel region including an oxide semiconductor material.

11. The method of claim 6, wherein each of the first low bandgap high mobility material and the second low bandgap high mobility material comprise a doped semiconductor material and the high bandgap low mobility material comprises an oxide semiconductor material.

12. The method of claim 6, wherein forming the channel region comprises forming the channel region such that the high bandgap low mobility material tapers from the source region to the drain region.

13. A method of forming a semiconductor device, the method comprising:
   forming a transistor comprising:
      forming a source including at least a first low bandgap high mobility material;
      forming a channel including another low bandgap high mobility material disposed between opposing portions of a high bandgap low mobility material and coupled to the first low bandgap high mobility material; and
      forming a drain including at least a second low bandgap high mobility material coupled to a portion of high bandgap low mobility material.

14. The method of claim 13, further comprising forming a gate electrode isolated from the channel via an insulative material.

15. The method of claim 14, wherein forming the channel includes forming the high bandgap low mobility material to have a length that is shorter than a length of the gate electrode.

16. The method of claim 13, wherein forming the transistor comprises forming the source, the channel, and the drain stacked on a substrate in a vertical orientation.

17. The method of claim 13, wherein forming the transistor comprises forming the source, the channel, and the drain on a substrate in a horizontal orientation.

18. The method of claim 13, wherein:
- forming the source including the first low bandgap high mobility material comprises forming the source including a first doped semiconductor material; and
- forming the drain including the second low bandgap high mobility material comprises forming the drain including the first doped semiconductor material.

\* \* \* \* \*